(12) United States Patent
Kim et al.

(10) Patent No.: US 12,010,880 B2
(45) Date of Patent: Jun. 11, 2024

(54) DISPLAY DEVICE CAPABLE OF MINIMIZING OUTGASSING FROM INSULATING LAYERS

(71) Applicant: Samsung Display Co., Ltd., Yongin-Si (KR)

(72) Inventors: Seong-Min Kim, Yongin-si (KR); Jin Koo Chung, Suwon-si (KR); Hyeon Sik Kim, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 355 days.

(21) Appl. No.: 17/210,607

(22) Filed: Mar. 24, 2021

(65) Prior Publication Data

US 2022/0028944 A1  Jan. 27, 2022

(30) Foreign Application Priority Data

Jul. 23, 2020  (KR) .......................... 10-2020-0091656

(51) Int. Cl.
| | |
|---|---|
| *H10K 59/124* | (2023.01) |
| *H10K 50/86* | (2023.01) |
| *H10K 59/122* | (2023.01) |
| *H10K 59/123* | (2023.01) |
| *H10K 59/131* | (2023.01) |

(52) U.S. Cl.
CPC ......... *H10K 59/124* (2023.02); *H10K 50/865* (2023.02); *H10K 59/122* (2023.02); *H10K 59/123* (2023.02); *H10K 59/131* (2023.02); *H10K 59/1315* (2023.02)

(58) Field of Classification Search
CPC .. H10K 59/124; H10K 59/131; H10K 59/122; H10K 59/123; H10K 50/865
See application file for complete search history.

(56) References Cited

U.S. PATENT DOCUMENTS

| | | | | |
|---|---|---|---|---|
| 2014/0027792 | A1* | 1/2014 | Iwasaki | ............... H10K 59/352 257/99 |
| 2015/0378182 | A1* | 12/2015 | Shin | ..................... H10K 59/126 252/586 |
| 2017/0069701 | A1* | 3/2017 | Cai | ........................ H10K 71/00 |
| 2017/0141172 | A1* | 5/2017 | Cho | ..................... H10K 59/123 |
| 2017/0323936 | A1* | 11/2017 | Lee | ..................... H10K 50/844 |

(Continued)

FOREIGN PATENT DOCUMENTS

| | | |
|---|---|---|
| KR | 10-0623254 B1 | 9/2006 |
| KR | 10-2014-0080229 A | 6/2014 |
| KR | 10-1766284 B1 | 8/2017 |

(Continued)

*Primary Examiner* — Lex H Malsawma
(74) *Attorney, Agent, or Firm* — Innovation Counsel LLP

(57) ABSTRACT

An exemplary embodiment of the present inventive concept provides a display device including: a substrate; a plurality of first wires extending along a first direction on the substrate; a first insulating layer disposed on the plurality of first wires; a plurality of second wires disposed on the first insulating layer and extending along a second direction crossing the first direction; a second insulating layer disposed on the plurality of second wires; and a plurality of pixel electrodes disposed on the second insulating layer, wherein the second insulating layer includes a first opening which is disposed between the plurality of pixel electrodes.

24 Claims, 34 Drawing Sheets

(56) References Cited

U.S. PATENT DOCUMENTS

2021/0280829 A1\* 9/2021 Choi .................... H10K 59/123

FOREIGN PATENT DOCUMENTS

| KR | 10-2018-0030363 A | 3/2018 |
| KR | 10-2018-0134638 A | 12/2018 |
| KR | 10-2021-0028780 A | 3/2021 |
| KR | 10-2021-0113532 A | 9/2021 |

\* cited by examiner

DISPLAY DEVICE CAPABLE OF MINIMIZING OUTGASSING FROM INSULATING LAYERS

CROSS-REFERENCE TO RELATED APPLICATION

This application claims priority to and benefits of Korean Patent Application No. 10-2020-0091656, filed in the Korean Intellectual Property Office on Jul. 23, 2020, the entire contents of which are incorporated herein by reference.

BACKGROUND (a) Technical Field

The present disclosure relates to a display device, and more specifically, to a display device that minimizes outgassing by removing a portion of an insulating layer.

(b) Description of the Related Art

A display device includes a plurality of pixels including a display element, and each of the pixels includes a plurality of wires and at least one transistor connected to the wires to drive the display device.

The transistor may be electrically connected to the display element to drive the display element by using signals applied from the wires.

The wires disposed in different layers should be insulated each other. In this case, an insulating layer disposed between the wires may include an organic film.

The above information disclosed in this Background section is only for enhancement of understanding of the background of the inventive concept, and therefore it may contain information that does not form the prior art that is already known in this country to a person of ordinary skill in the art.

SUMMARY

The present inventive concept has been made in an effort to provide a display device capable of minimizing outgassing by removing a portion of an insulating layer.

An exemplary embodiment of the present inventive concept provides a display device including: a substrate; a plurality of first wires extending along a first direction on the substrate; a first insulating layer disposed on the plurality of first wires; a plurality of second wires disposed on the first insulating layer and extending along a second direction crossing the first direction; a second insulating layer disposed on the plurality of second wires; and a plurality of pixel electrodes disposed on the second insulating layer, wherein the second insulating layer includes a first opening which is disposed between the plurality of pixel electrodes.

The plurality of second wires may overlap the plurality of pixel electrodes in a plan view and the first opening is disposed in an area disposed between the plurality of pixel electrodes that are adjacent to each other in the first direction.

The plurality of pixel electrodes may include: a plurality of first pixel electrodes and a plurality of second pixel electrodes disposed in a first column along the second direction, and a plurality of third pixel electrodes disposed in a second column along the second direction, and wherein the first opening is disposed between the first column and the second column disposed adjacent to each other.

The first insulating layer may be disposed to overlap the plurality of first wires in a plan view, and includes a second opening disposed between adjacent first wires that are adjacent to each other in the second direction.

The second opening may extend along the first direction.

The first insulating layer may include a disconnected portion in an area corresponding to the first opening of the second insulating layers.

The first insulating layer may include a plurality of islands that are spaced apart from each other along the first direction.

The display device may further include a passivation layer disposed between the plurality of first wires and the first insulating layer.

The plurality of first wires may serve as scan lines for transferring scan signals and the plurality of second wires serve as data lines for transferring data voltages or driving voltage lines for transferring driving voltages.

Each thickness of the first insulating layer and the second insulating layers may be in a range of 10,000 Å to 16,000 Å.

The display device may further include a partition wall disposed on the plurality of pixel electrodes, wherein the partition wall has an opening exposing the plurality of pixel electrodes and a portion of the partition wall protrudes to constitute a spacer.

The partition wall may include a black material.

The first insulating layer or the second insulating layers may include a black material.

The first insulating layer or the second insulating layer may include siloxane.

An exemplary embodiment of the present inventive concept provides a display device including: a substrate; a plurality of first wires extending along a first direction on the substrate; a plurality of first insulating layers disposed on the plurality of first wires; a plurality of second wires disposed on the first insulating layer and extending along a second direction crossing the first direction; a second insulating layer disposed on the plurality of second wires; and a plurality of pixel electrodes disposed on the second insulating layer, wherein the plurality of first insulating layers are disposed between the plurality of first wires that are adjacent to each other in the second direction.

Each of the plurality of first insulating layers may include a disconnected portion.

The second insulating layer may be disposed to overlap the plurality of first wires and the plurality of second wires in a plan view.

The plurality of first wires may serve as scan lines for transferring scan signals and the plurality of second wires serve as data lines for transferring data voltages or driving voltage lines for transferring driving voltages.

An exemplary embodiment of the present inventive concept provides a display device including: a substrate; a plurality of first wires extending along a first direction on the substrate; a first insulating layer disposed on the plurality of first wires; a plurality of second wires disposed on the first insulating layer and extending along a second direction crossing the first direction; a second insulating layer disposed on the plurality of second wires; and a plurality of pixel electrodes disposed on the second insulating layer, wherein the second insulating layer including an opening disposed between the plurality of second wires along the second direction.

The plurality of second wires may be disposed to overlap the plurality of pixel electrodes in a plan view and the opening is disposed between the plurality of pixel electrodes that are adjacent to each other in the first direction.

The first insulating layer may be disposed to overlap the plurality of first wires in a plan view and has a removed portion extending along the first direction between adjacent first wires.

The first insulating layer may extend along the first direction.

The first insulating layer may be removed at an area that is overlapped with the opening of the second insulating layers.

The plurality of first wires may serve as a scan line for transferring a scan signal, and the second wires may serve as scan lines for transferring scan signals and the plurality of second wires serve as data lines for transferring data voltages or driving voltage lines for transferring driving voltages.

According to the exemplary embodiments, it is possible to provide a display device capable of minimizing outgassing by removing a portion of an insulating layer.

DETAILED DESCRIPTION OF THE EMBODIMENTS

Figure 1:
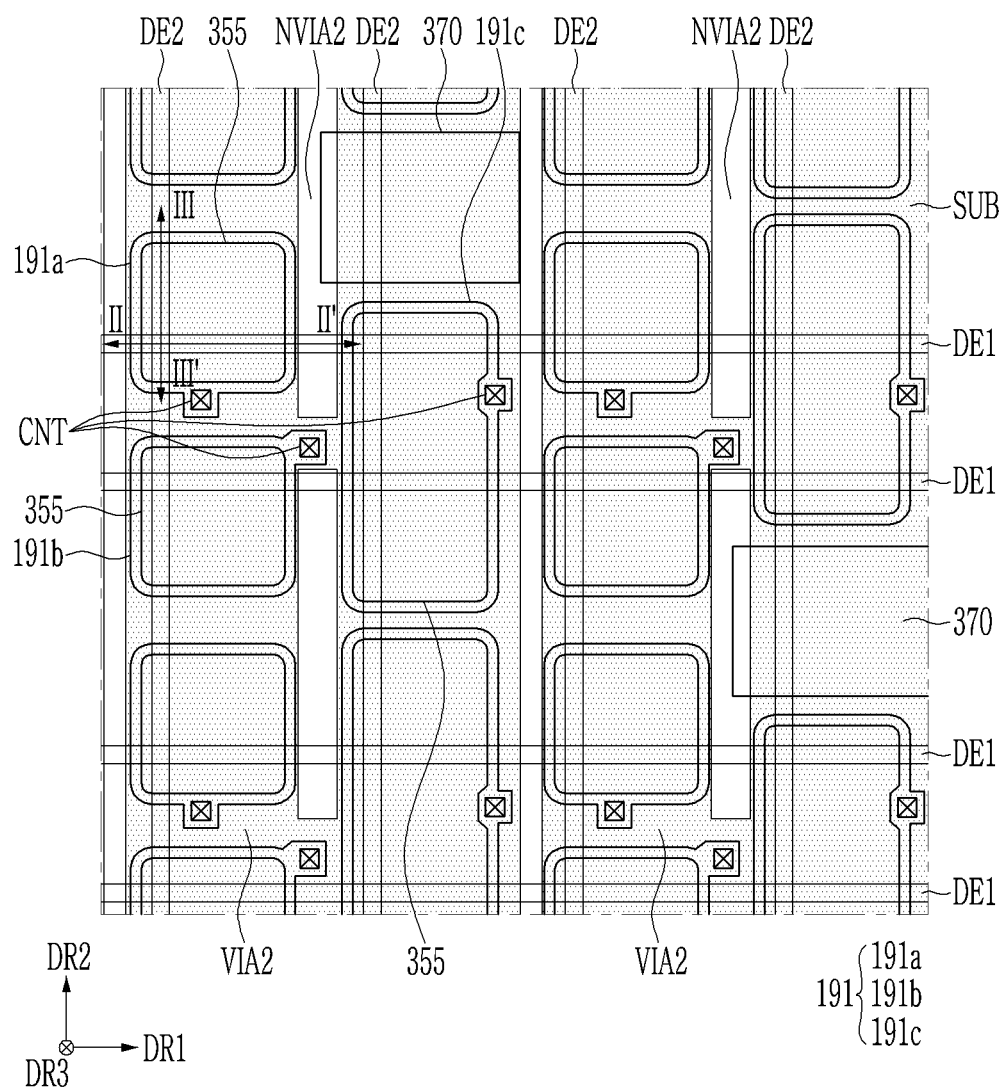
FIG. 1 schematically illustrates a top plan view of a display device according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Hereinafter, a display device according to an exemplary embodiment of the present inventive concept will be described in detail with reference to drawings.

Figure 2:
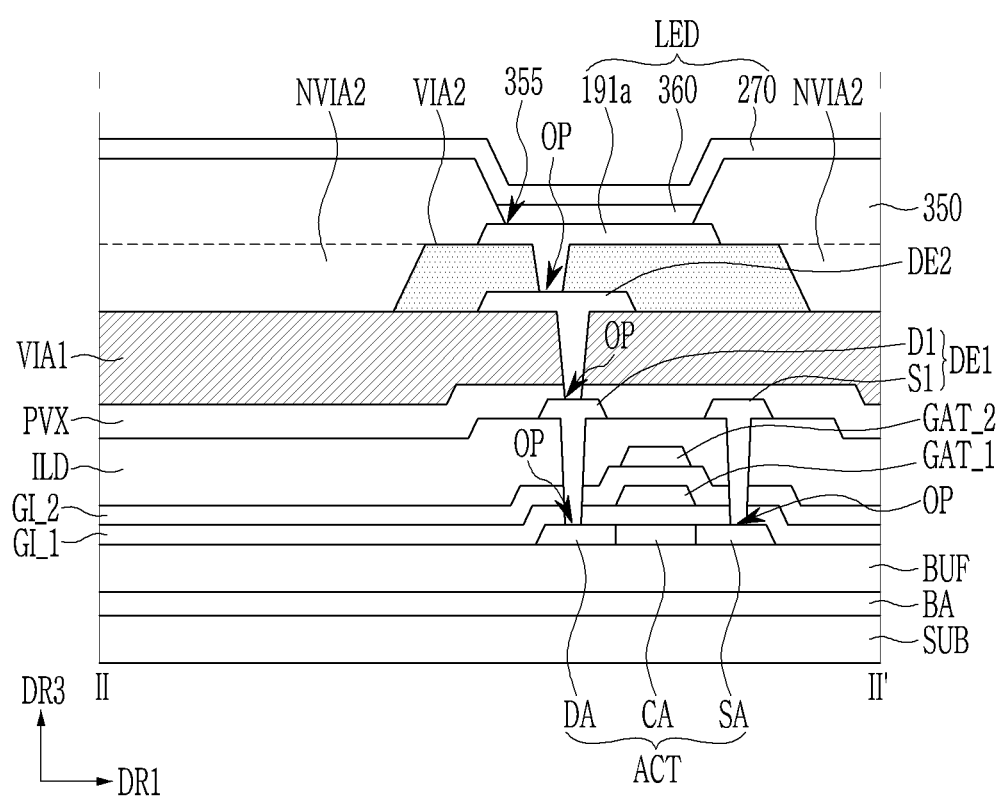
FIG. 2 illustrates a cross-sectional view taken along a line II-II' of FIG. 1.
Figure 3:
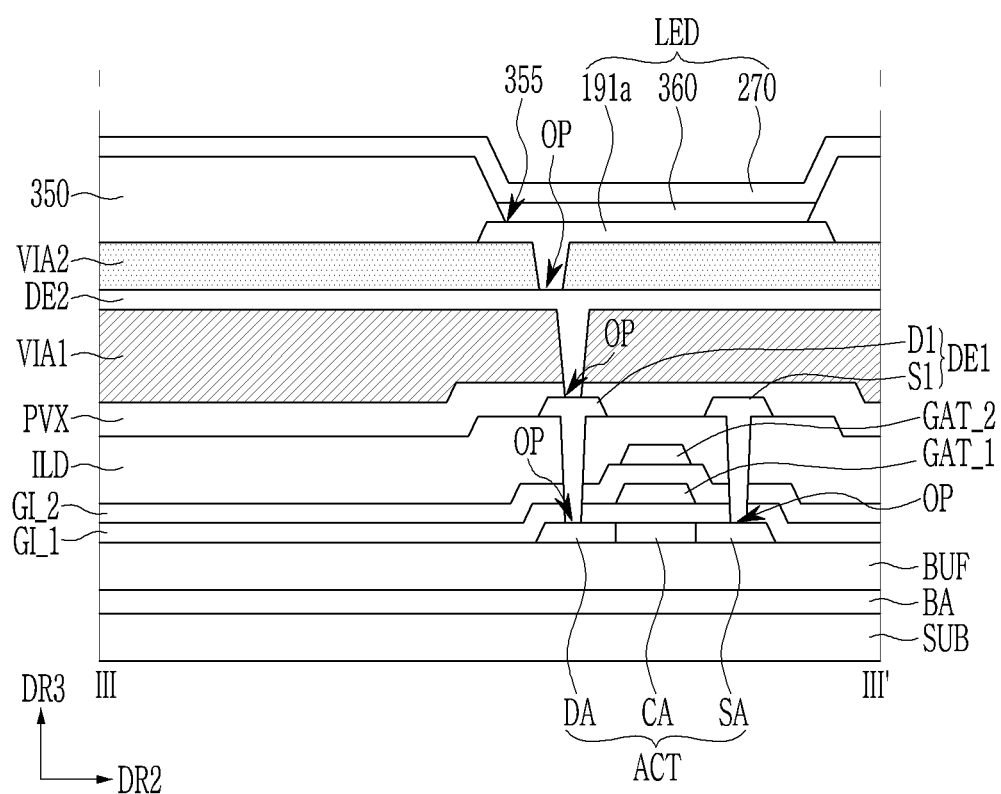
FIG. 3 illustrates a cross-sectional view taken along a line III-III' of FIG. 1.

FIG. 1 schematically illustrates a top plan view of a display device according to an exemplary embodiment of the present inventive concept. FIG. 2 illustrates a cross-sectional view taken along a line II-II' of FIG. 1. FIG. 3 illustrates a cross-sectional view taken along a line III-III' of FIG. 1. FIG. 1 illustrates only some components to describe key features of the present inventive concept, and FIG. 2 to FIG. 3 also illustrate virtual cross-sections for describing the main features of the present inventive concept, and do not exactly coincide with cross-sectional lines of FIG. 1.

Referring to FIG. 1, a pixel electrode 191 is disposed on a substrate SUB. The pixel electrode 191 may include a first pixel electrode 191a, a second pixel electrode 191b, and a third pixel electrode 191c. A portion of each of the first pixel electrode 191a, the second pixel electrode 191b, and the third pixel electrode 191c, for example, a contact pad, may protrude to be connected to a contact portion CNT. The first pixel electrode 191a, the second pixel electrode 191b, and the third pixel electrode 191c may each receive a voltage through the contact portion CNT. The contact portion CNT may be connected to a transistor (not illustrated). The first pixel electrode 191a and the second pixel electrode 191b may be disposed in a same column along a second direction DR2, and the third pixel electrode 191c may be disposed in a column adjacent to the column in which the first pixel electrode 191a and the second pixel electrode 191b are disposed. A spacer 370 may be disposed in the column in which the third pixel electrode 191c is disposed.

A partition wall (not illustrated) may be disposed on the first pixel electrode 191a, the second pixel electrode 191b, and the third pixel electrode 191c, and may have openings 355 exposing the first pixel electrode 191a, the second pixel electrode 191b, and the third pixel electrode 191c, respectively. A portion of the partition wall may protrude to constitute the spacer 370.

A pixel corresponding to the first pixel electrode 191a may emit red light, a pixel corresponding to the second pixel electrode 191b may emit green light, and a pixel corresponding to the third pixel electrode 191c may emit blue light.

Referring back to FIG. 1, the display device according to the present exemplary embodiment may include a first data conductive layer DE1 extending along a first direction DR1 and a second data conductive layer DE2 disposed along the second direction DR2 intersecting the first direction DR1. For better comprehension and ease of description, although only one first data conductive layer DE1 and one second data conductive layer DE2 for the first pixel electrode 191a and the second pixel electrode 191b, and two first data conductive layer DE1 and one second data conductive layer DE2 for the third pixel electrode 191c are illustrated, a plurality of first and second data conductive layers DE1 and DE2 may be actually disposed under one of the pixel electrodes 191a, 191b, and 191c. The first data conductive layer DE1 may be a scan line that transfers a scan signal. In addition, the second data conductive layer DE2 may be a data line transferring a data voltage or a driving voltage line transferring a driving voltage.

Referring to FIG. 1, each of the second data conductive layers DE2 is disposed to overlap the pixel electrodes in each column. That is, the second data conductive layers DE2 are disposed to overlap the first pixel electrode 191a, the second pixel electrode 191b, and the third pixel electrode 191c, and are not disposed in a region disposed between adjacent pixel electrodes along the first direction D1.

The second intermetal dielectric VIA2 is removed along the column direction (the second direction DR2) in the region disposed between adjacent pixel electrodes along the first direction DR1. In FIG. 1, a region where the second intermetal dielectric VIA2 is disposed and a region where the second intermetal dielectric VIA2 is removed are separately illustrated. The region where the second intermetal dielectric VIA2 is disposed is indicated by a dot pattern, and the region NVIA2 where the second intermetal dielectric VIA2 is removed is indicated without the dot pattern.

The removed region NVIA2 of the second intermetal dielectric VIA2 is a region disposed between the adjacent pixel electrodes 191a, 191b, and 191c along the first direction DR1. The second data conductive layer DE2 is not disposed in the removed region NVIA2 of the second intermetal dielectric VIA2. However, the second intermetal dielectric VIA2 overlapping the contact point CNT is not removed.

That is, in the display device according to the present exemplary embodiment, the second data conductive layer DE2 is disposed to overlap the pixel electrodes 191a, 191b, and 191c, and is not disposed in the regions disposed between adjacent pixel electrodes 191a, 191b, and 191c along the first direction DR1. Accordingly, the second intermetal dielectric VIA2 disposed on the second data conductive layer DE2 between the adjacent pixel electrodes 191a, 191b, and 191c along the first direction DR1 may be removed. Therefore, outgassing from the second intermetal dielectric VIA2 and a resulting shrinkage phenomenon may be minimized, and reliability of the display device may be improved.

FIG. 2 illustrates a cross-sectional view taken along a line II-II' of FIG. 1. FIG. 3 illustrates a cross-sectional view taken along a line III-III' of FIG. 1. However, FIG. 2 and FIG. 3 respectively illustrate conceptual views to show shapes of the second intermetal dielectric VIA2 and the first intermetal dielectric VIA1 in the cross-section of FIG. 1 in the first direction DR1 and in the cross-section of FIG. 1 in the second direction DR2, and the cross-sectional lines and corresponding structures may not exactly coincide with each other. That is, FIG. 2 and FIG. 3 have been described focusing on a core structure of a pixel of the display device for better comprehension and ease of description, and the cross-sectional lines illustrated in FIG. 1 and the cross-sections illustrated in FIG. 2 and FIG. 3 do not exactly coincide with each other. Detailed top plan and cross-sectional views will be described later as separate drawings.

Referring to FIG. 2 and FIG. 3, a barrier layer BA may be disposed on the substrate SUB. The barrier layer BA may include an inorganic material, and for example, may include an inorganic insulating material such as a silicon nitride (SiNx), a silicon oxide (SiOx), and a silicon oxynitride (SiOxNy). Herein, x and y may be 1 to 10. The barrier layer BA may have a single layer structure or a multilayer structure of the material.

A buffer layer BUF may be disposed on the barrier layer BA. The buffer layer BUF may include an inorganic insulating material such as a silicon nitride (SiNx), a silicon oxide (SiOx), and a silicon oxynitride (SiOxNy). The buffer layer BUF may have a single layer structure or a multilayer structure of the material.

A semiconductor layer ACT may be disposed on the buffer layer BUF. The semiconductor layer ACT may include any one of amorphous silicon, polycrystalline silicon, and an oxide semiconductor. For example, the semiconductor layer ACT may include low temperature polysilicon (LTPS), or may include an oxide semiconductor material including at least one of zinc (Zn), indium (In), gallium (Ga), tin (Sn), and a mixture thereof. For example, the semiconductor layer ACT may include an indium-gallium-zinc oxide (IGZO).

The semiconductor layer ACT may include a source region SA, a drain region DA, and a channel region CA disposed between the source region SA and the drain region DA.

A first gate insulating layer GI_1 may be disposed on the semiconductor layer ACT. The first gate insulating layer GI_1 may include an inorganic insulating material such as a silicon nitride (SiNx), a silicon oxide (SiOx), and a silicon oxynitride (SiOxNy). The first gate insulating layer GI_1 may have a single layer structure or a multilayer structure of the material. A first gate electrode GAT_1 may be disposed on the first gate insulating layer GI_1. The first gate electrode GAT_1 may be disposed to overlap the channel region CA of the semiconductor layer ACT in a plan view. The first gate electrode GAT_1 may include molybdenum (Mo), aluminum (Al), copper (Cu), and/or titanium (Ti), and may have a single layer structure or a multilayer structure of the material.

Next, the second gate insulating layer GI_2 may be disposed on the first gate electrode GAT_1. The second gate insulating layer GI_2 may include an inorganic insulating material such as a silicon nitride (SiNx), a silicon oxide (SiOx), and a silicon oxynitride (SiOxNy).

A second gate electrode GAT_2 may be disposed on the second gate insulating layer GI_2. The second gate electrode GAT_2 may be disposed to overlap the first gate electrode GAT_1 in a plan view with the second gate insulating layer GI_2 disposed therebetween. The second gate electrode GAT_2 may include molybdenum (Mo), aluminum (Al), copper (Cu), and/or titanium (Ti), and may have a single layer structure or a multilayer structure of the material.

The first gate electrode GAT_1 and the second gate electrode GAT_2 overlapping each other with the second gate insulating layer GI_2 disposed therebetween may constitute a capacitor.

An interlayer insulating layer ILD may be disposed on the second gate electrode GAT_2. The interlayer insulating layer GI_2 may include an inorganic insulating material such as a silicon nitride (SiNx), a silicon oxide (SiOx), and a silicon oxynitride (SiOxNy).

A first data conductive layer DE1 may be disposed on the interlayer insulating layer ILD. The first data conductive layer DE1 may be aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may have a single layer structure or a multilayer structure of the material. The first data conductive layer DE1 may include a first source electrode S1 and a first drain electrode D1 that are spaced apart from each other. The first source electrode S1 may be connected to the source region SA of the semiconductor layer ACT through openings OP disposed in the first gate insulating layer GI_1, the second gate insulating layer GI_2, and the interlayer insulating layer ILD. In addition, the first drain electrode D1 may be connected to the drain region DA of the semiconductor layer ACT through the openings OP disposed in the first gate insulating layer GI_1, the second gate insulating layer GI_2, and the interlayer insulating layer ILD.

In FIG. 2 and FIG. 3, the first data conductive layer DE1 is briefly illustrated with only the first source electrode S1 and the first drain electrode D1, but this is conceptually illustrated for convenience of description, and an actual structure thereof may be different therefrom.

A passivation layer PVX may be disposed on the first data conductive layer DE1. The passivation layer PVX may include an inorganic insulating material such as a silicon nitride (SiNx), a silicon oxide (SiOx), and a silicon oxynitride (SiOxNy). The passivation layer PVX may be omitted according to an exemplary embodiment.

A first intermetal dielectric VIA1 may be disposed on the passivation layer PVX. The first intermetal dielectric VIA1 may be an organic layer. Specifically, the first intermetal dielectric VIA1 may include a general purpose polymer such as polymethylmethacrylate (PMMA) or polystyrene (PS), a polymer derivative having a phenolic group, an organic insulating material such as an acrylic polymer, an imide polymer, a polyimide, an acrylic polymer, a siloxane polymer, etc. A thickness of the first intermetal dielectric VIA1 may be in a range of 10,000 Å to 16,000 Å. The first intermetal dielectric VIA1 may be disposed on the passivation layer PVX except for the openings OP.

The second data conductive layer DE2 may be disposed on the first intermetal dielectric VIA1. The second data conductive layer DE2 may include a data line through which a data voltage is transferred. The second data conductive layer DE2 is aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may have a single layer structure or a multilayer structure of the material. The second data conductive layer DE2 may be connected to the first drain electrode D1 through the openings OP disposed in the first intermetal dielectric VIA1 and the passivation layer PVX. In FIG. 2 and FIG. 3, the second data conductive layer DE2 is briefly illustrated, but this is conceptually illustrated for convenience of description, and an actual structure thereof may be different therefrom.

A second intermetal dielectric VIA2 may be disposed on the second data conductive layer DE2. The second intermetal dielectric VIA2 may be an organic layer. Specifically, the second intermetal dielectric VIA2 may include a general purpose polymer such as polymethylmethacrylate (PMMA) or polystyrene (PS), a polymer derivative having a phenolic group, an organic insulating material such as an acrylic polymer, an imide polymer, a polyimide, an acrylic polymer, a siloxane polymer, etc. A thickness of the second intermetal dielectric VIA2 may be in a range of 10,000 Å to 16,000 Å.

Referring to FIG. 2 and FIG. 3, opposite edges of the second intermetal dielectric VIA2 in the first direction DR1 are removed. In FIG. 2, the region NVIA2 in which the second intermetal dielectric VIA2 is removed is illustrated by a dotted line. However, referring to FIG. 3, the second intermetal dielectric VIA2 is continuously disposed along the second direction DR2 without being removed.

That is, referring to FIG. 1 to FIG. 3, the second intermetal dielectric VIA2 disposed between adjacent pixel electrode along the second direction DR2 is removed. For example, the intermetal dielectric VIA2 disposed between a first column where the first pixel electrode 191a and the second pixel electrode 191b are disposed and a second column where the third pixel electrode 191c and the spacer 370 are disposed is removed except a region in which the contact portion CNT is disposed. As the second intermetal dielectric VIA2 is removed in this way, a volume occupied by the second intermetal dielectric VIA2 in the display device may be reduced, and thus, deterioration of the display device due to outgassing from the second intermetal dielectric VIA2 may be prevented. Specific effects will be described later separately.

Referring back to FIGS. 2 and 3, the first pixel electrode 191a may be disposed on the second intermetal dielectric VIA2. The first pixel electrode 191a may be connected to the second data conductive layer DE2 through the opening OP disposed in the second intermetal dielectric VIA2.

A partition wall 350, for example, a pixel defining layer, is disposed on the first pixel electrode 191a. The partition wall 350 has an opening 355 exposing the first pixel electrode 191a. Although not illustrated in FIG. 2 and FIG. 3, a portion of the partition wall 350 may constitute the spacer 370. As illustrated in FIG. 1, the spacer 370 may be disposed in a same column as the third pixel electrode 191c.

An emission layer 360 may be disposed in the opening 355 of the partition wall 350. A common electrode 270 may be disposed on the partition wall 350 and the emission layer 360. The first pixel electrode 191a, the emission layer 360, and the common electrode 270 may constitute a light emitting diode LED.

Figure 4:
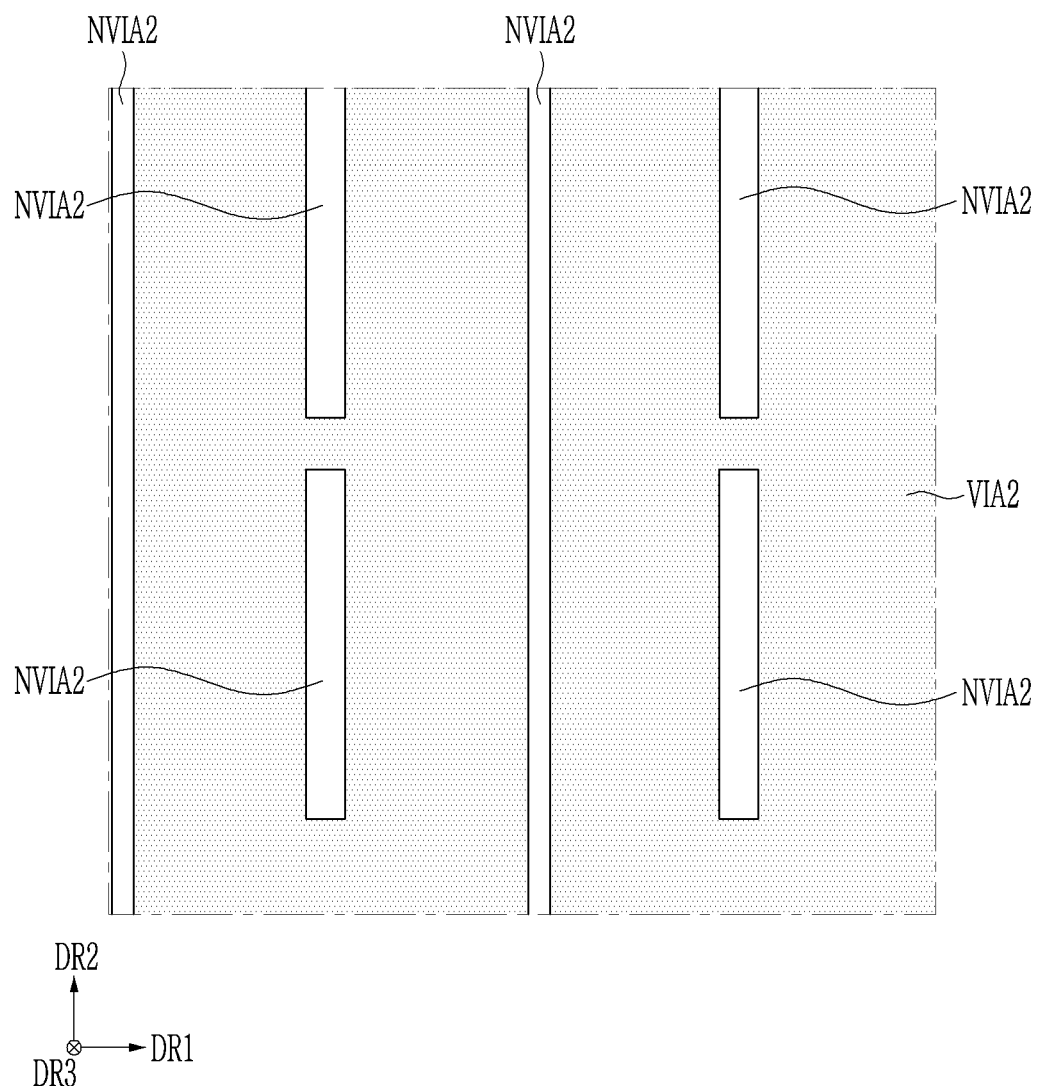
FIG. 4 illustrates a configuration of a second intermetal dielectric disposed in an area displayed in FIG. 1.

FIG. 4 illustrates a configuration of the second intermetal dielectric VIA2 disposed in an area displayed in FIG. 1. In FIG. 4, the second intermetal dielectric VIA2 is indicated by a dot pattern.

Referring to FIG. 1 to FIG. 4, in the display device according to the present exemplary embodiment, the second data conductive layer DE2 is disposed to overlap the pixel electrodes 191a, 191b, and 191c, and the second data conductive layer DE2 is not disposed in spaces between the adjacent pixel electrodes 191a, 191b, and 191c. In this case, the second intermetal dielectric VIA2 may be removed along the second direction DR2 in the spaces disposed between the adjacent pixel electrodes 191a, 191b, and 191c where the second data conductive layer DE2 is not disposed, thereby preventing deterioration of the display device due to the outgassing from the second intermetal dielectric VIA2.

Figure 5:
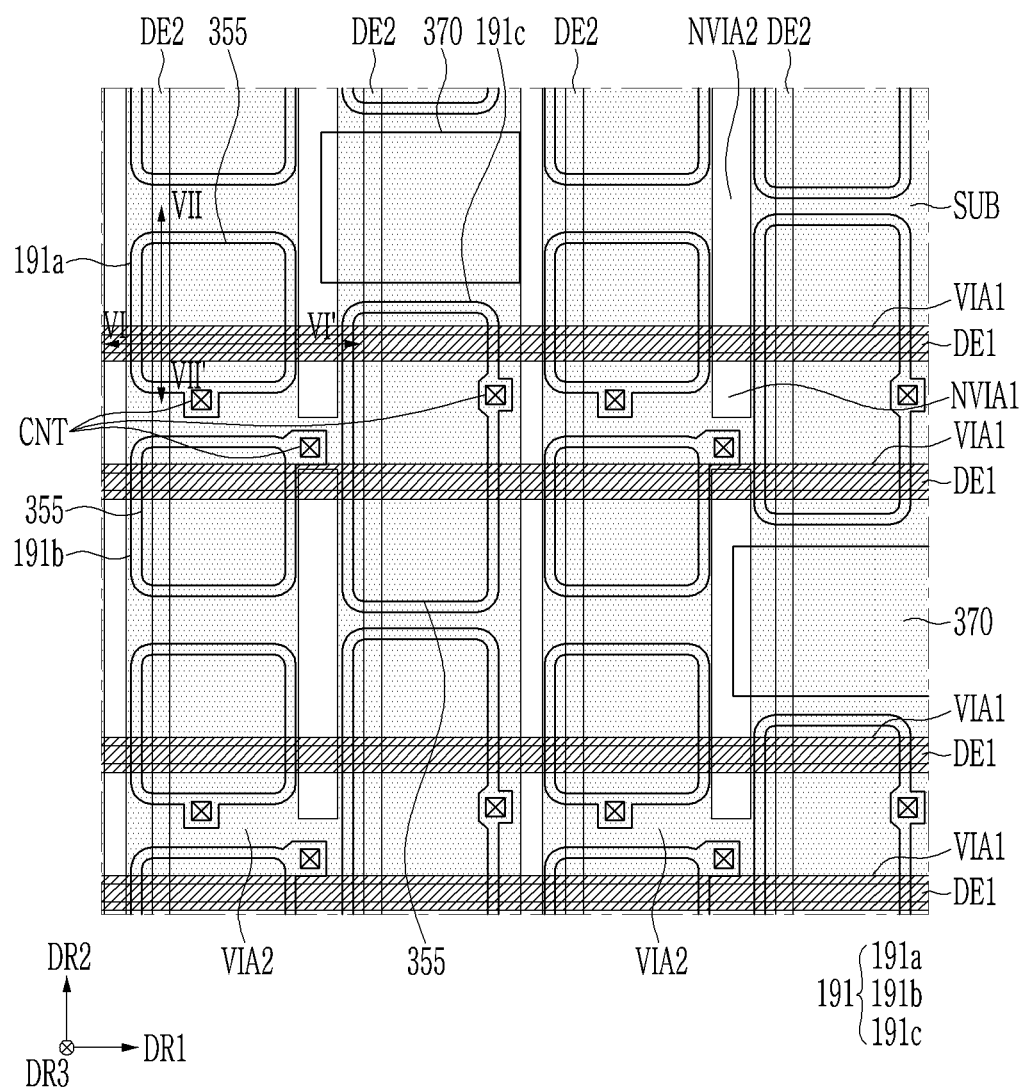
FIG. 5 illustrates a plan view corresponding to that of FIG. 1 for a display device according to another exemplary embodiment.
Figure 6:
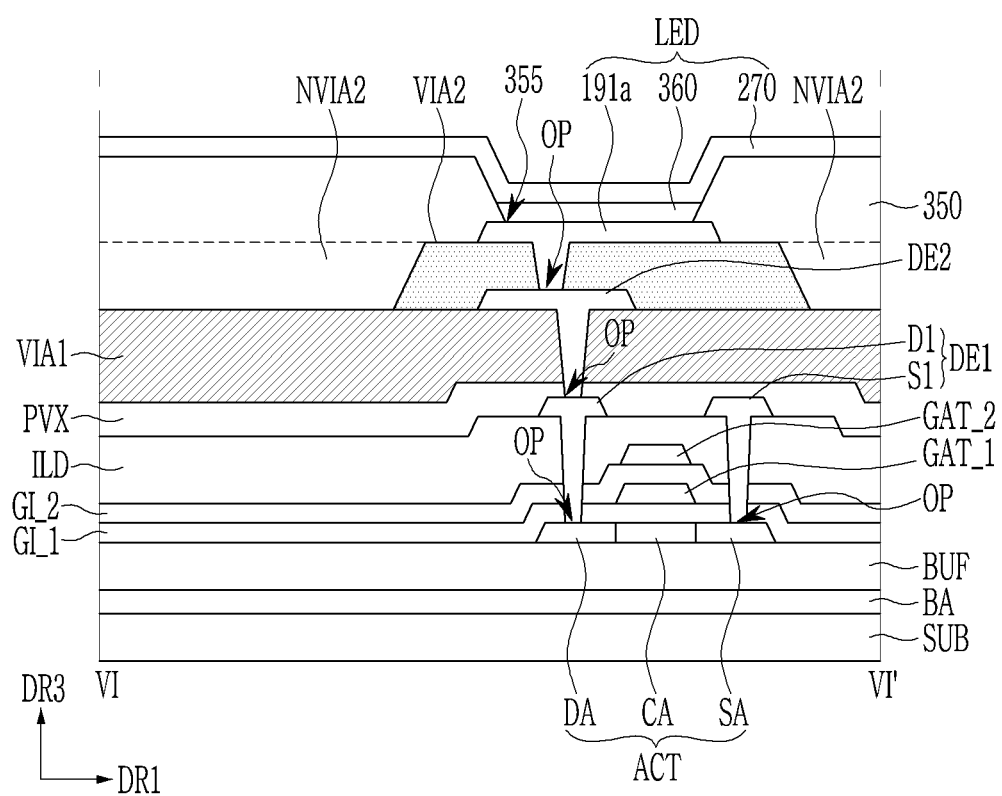
FIG. 6 illustrates a cross-sectional view taken along a line VI-VI' of FIG. 5.
Figure 7:
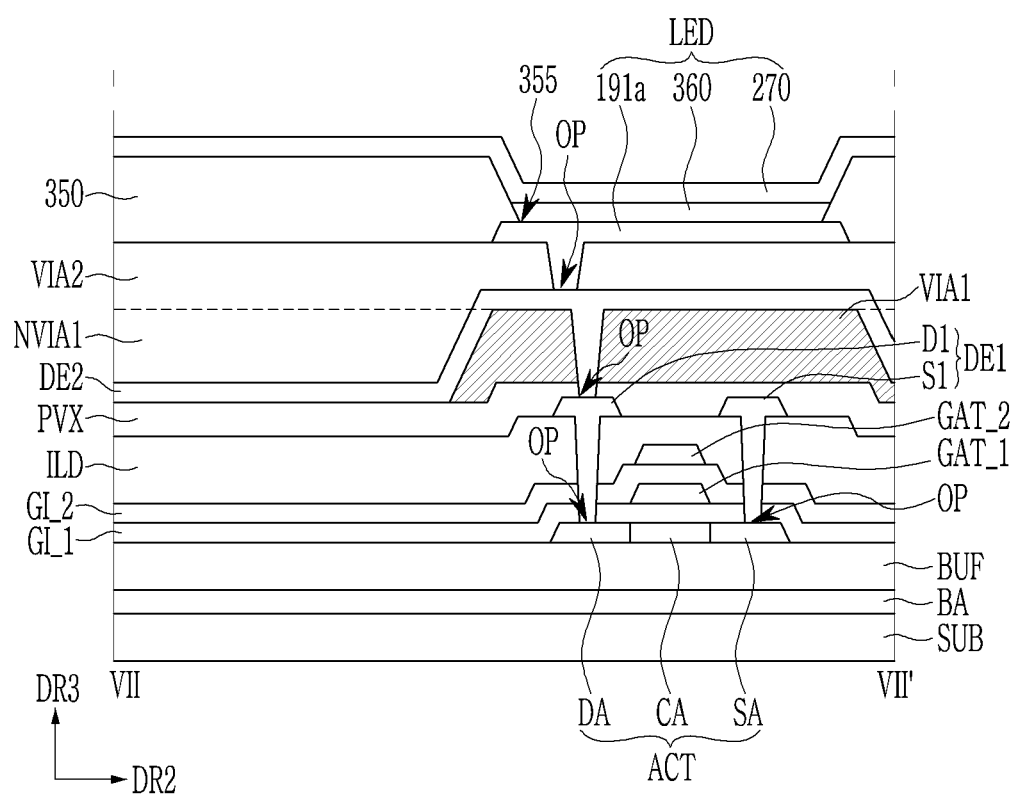
FIG. 7 illustrates a cross-sectional view taken along a line VII-VII' of FIG. 5.

FIG. 5 illustrates a plan view corresponding to that of FIG. 1 for a display device according to another exemplary embodiment. FIG. 6 illustrates a cross-sectional view taken along a line VI-VI' of FIG. 5, and FIG. 7 illustrates a cross-sectional view taken along a line VII-VII' of FIG. 5. FIG. 5 illustrates only some components to describe key features of the present inventive concept, and FIG. 6 to FIG. 7 also illustrate virtual cross-sections for describing the main features of the present inventive concept, and do not exactly coincide with cross-sectional lines of FIG. 5. Referring to FIG. 5, the exemplary embodiment of FIG. 5 is identical to the exemplary embodiment of FIG. 1 except that a portion of the first intermetal dielectric VIA1 is removed along the first direction DR1. A detailed description of same constituent elements will be omitted.

In FIG. 5, a region in which the first intermetal dielectric VIA1 is disposed is a region overlapping the first data conductive layer DE1 in a plan view. That is, the first intermetal dielectric VIA1 is disposed along the first direction DR1 on the first data conductive layer DE1, and is removed in other regions. The removed region NVIA1 of the first intermetal dielectric VIA1 is also disposed along the first direction DR1 on the first data conductive layer DE1.

Referring to FIG. 6, the first intermetal dielectric VIA1 in the region where the first data conductive layer DE1 is disposed is not removed. FIG. 6 illustrates only a first drain electrode D1 and a first source electrode S1 for convenience of description, but the first data conductive layer DE1 may be continuously disposed along the first intermetal dielectric VIA1 to overlap the first intermetal dielectric VIA1 in a plan view as illustrated in FIG. 5.

Referring to FIG. 7, a portion of the first intermetal dielectric VIA1 is removed. In FIG. 7, the region NVIA1 in which the first intermetal dielectric VIA1 is removed is illustrated by a dotted line. That is, referring to FIG. 5 and FIG. 7, the second intermetal dielectric VIA2 is continuously disposed along the second direction DR2, but the first intermetal dielectric VIA1 is partially disposed only in a region overlapping the first data conductive layer DE1 and is removed in other regions.

Figure 8:
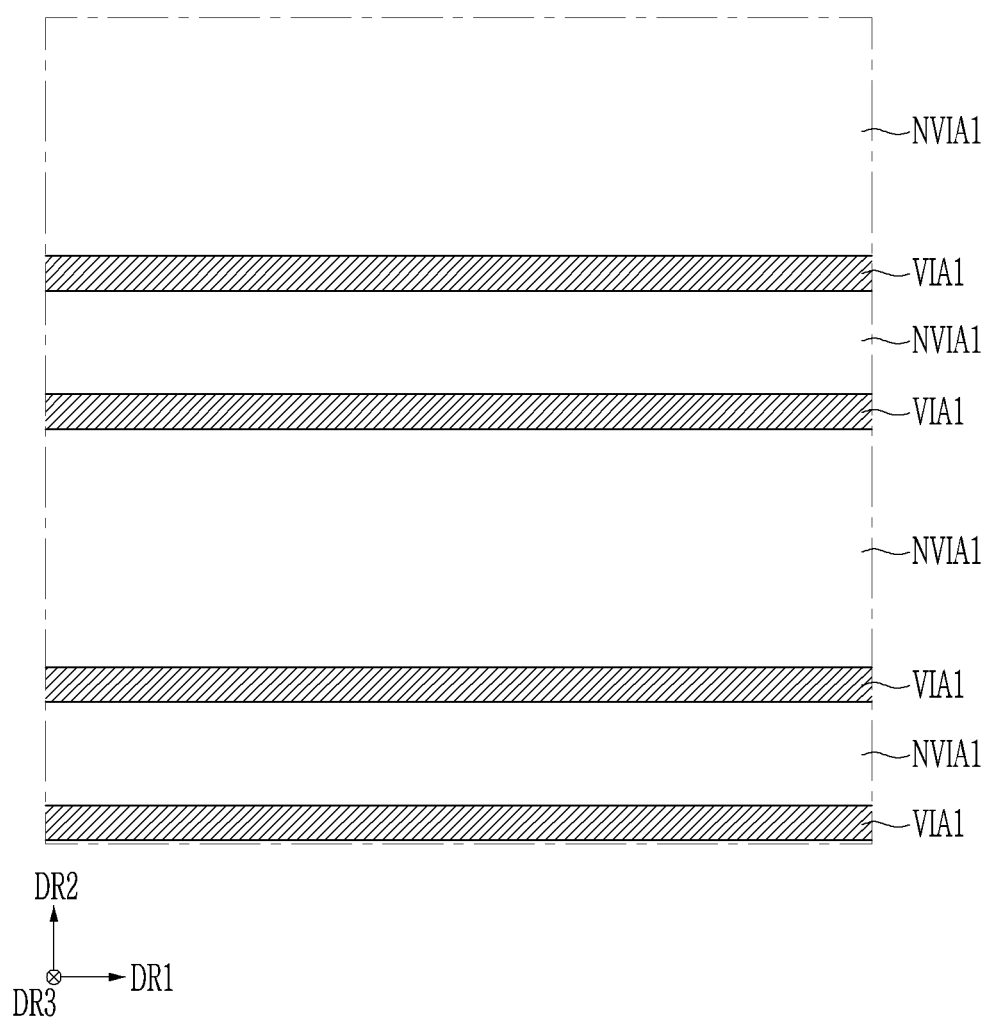
FIG. 8 illustrates a configuration of a first intermetal dielectric disposed in an area displayed in FIG. 5.

FIG. 8 illustrates a configuration of the first intermetal dielectric VIA1 disposed in an area displayed in FIG. 5. In FIG. 8, the first intermetal dielectric VIA1 is illustrated as a hatched portion. The region NVIA1 in which the first intermetal dielectric VIA1 is removed is areas without the hatching.

Figure 9:
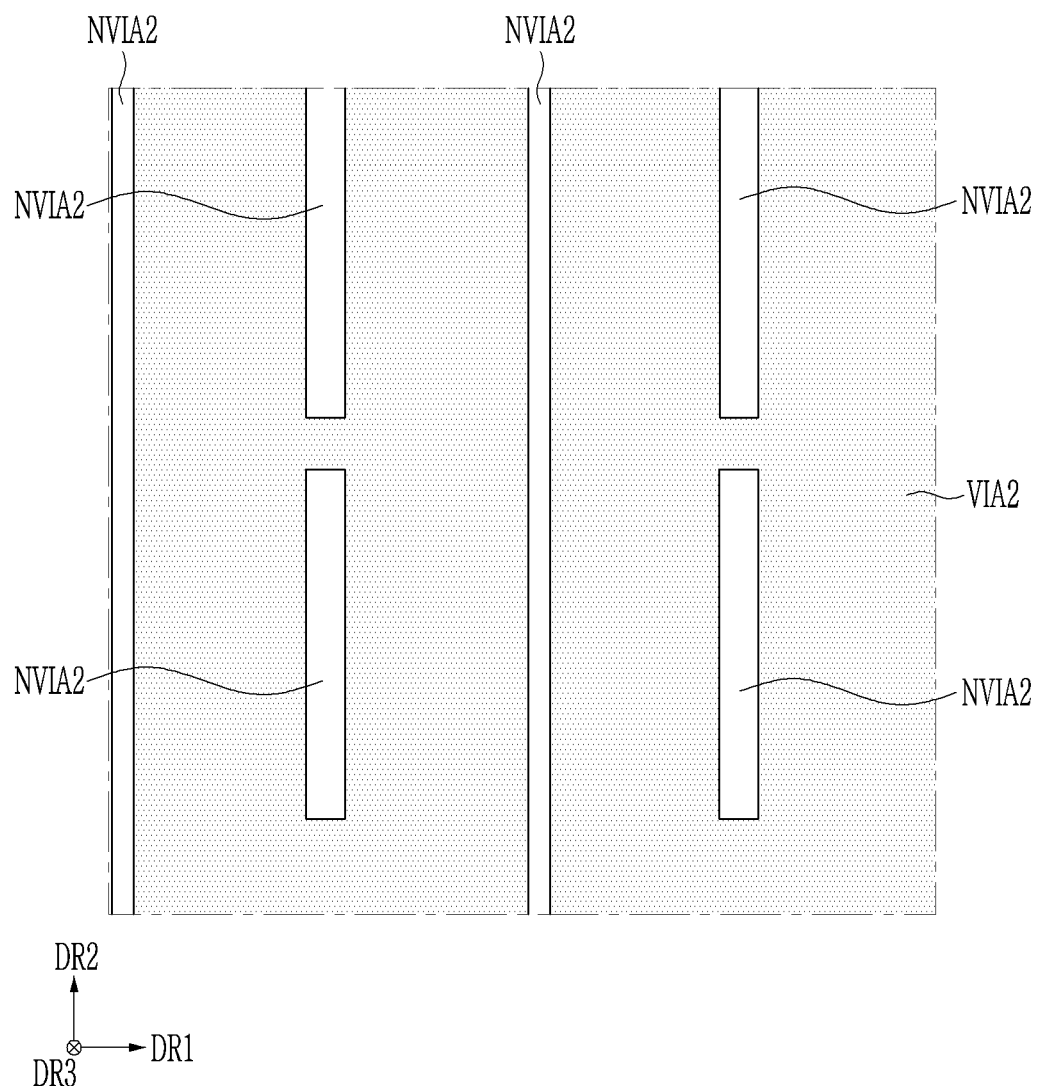
FIG. 9 illustrates a configuration of a second intermetal dielectric disposed in an area displayed in FIG. 5.

Similarly, FIG. 9 illustrates a configuration of the second intermetal dielectric VIA2 disposed in an area displayed in FIG. 5. In FIG. 9, the second intermetal dielectric VIA2 is illustrated as dot patterns. In FIG. 9, the region NVIA2 in which the second intermetal dielectric VIA2 is removed is illustrated without dot patterns.

Referring to FIG. 5, FIG. 8, and FIG. 9, the second intermetal dielectric VIA2 disposed between the pixel electrodes 191a, 191b, and 191c is removed along the column direction (the second direction DR2), and the first intermetal dielectric VIA1 is partially disposed only in the region overlapping the first data conductive layer DE1 in a plan view and is removed in other regions. The first intermetal dielectric VIA1 is disposed to overlap the first data conductive layer DE1 along the first direction DR1 and is removed in other regions.

Accordingly, an area occupied by the first intermetal dielectric VIA1 and the second intermetal dielectric VIA2 in the entire display device structure is reduced, and accordingly, it is possible to prevent the display device from being deteriorated due to outgassing from the first intermetal dielectric VIA1 and the second intermetal dielectric VIA2.

Figure 10:
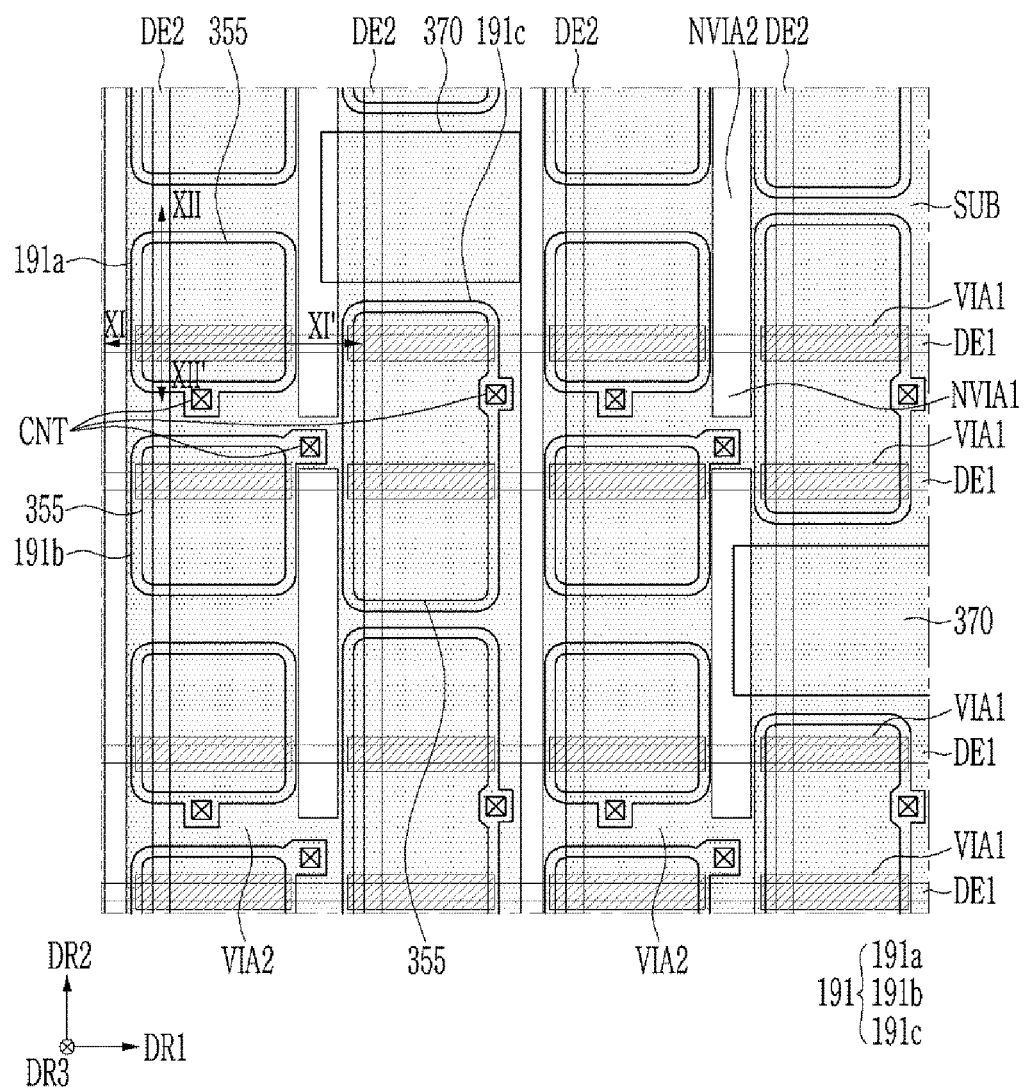
FIG. 10 illustrates a plan view corresponding to that of FIG. 1 for a display device according to another exemplary embodiment.
Figure 11:
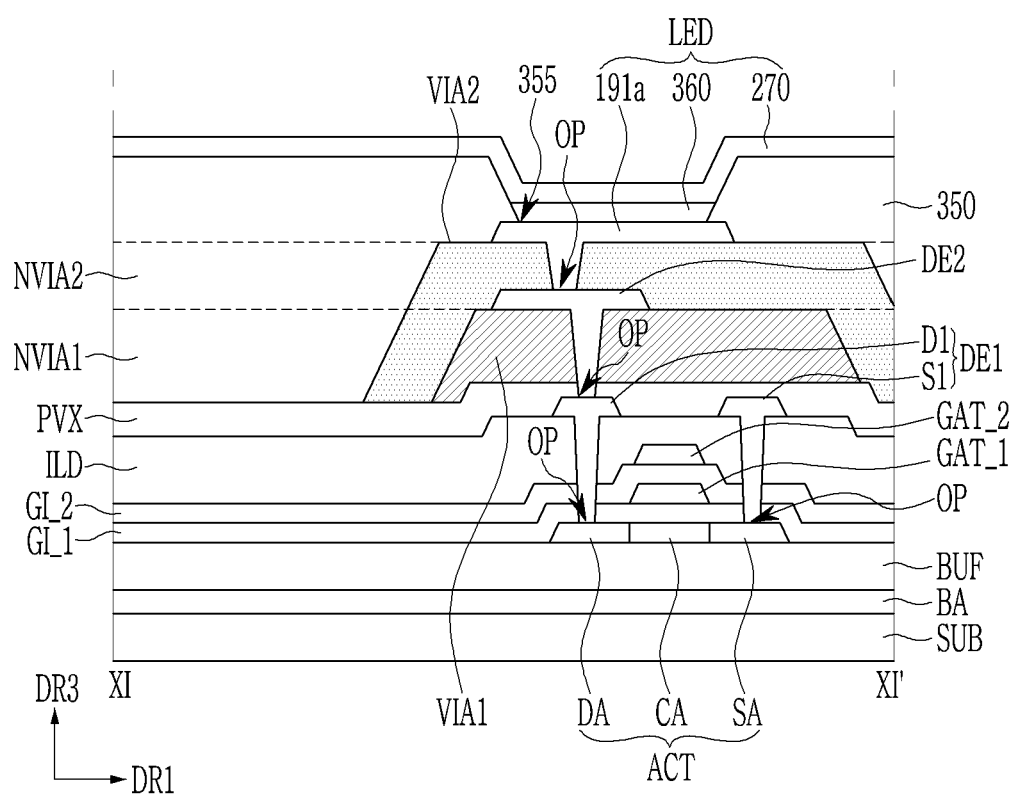
FIG. 11 illustrates a cross-sectional view taken along a line XI-XI' of FIG. 10.
Figure 12:
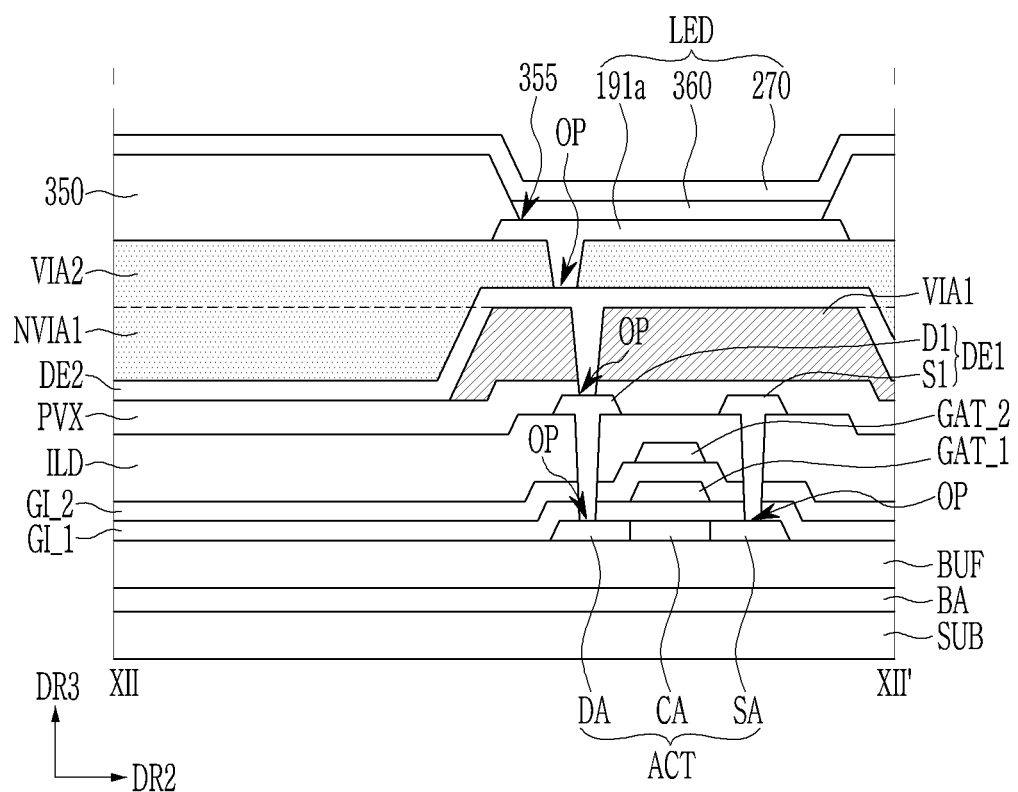
FIG. 12 illustrates a cross-sectional view taken along a line XII-XII' of FIG. 10.

FIG. 10 illustrates a plan view corresponding to that of FIG. 1 for a display device according to another exemplary embodiment. FIG. 11 illustrates a cross-sectional view taken along a line XI-XI' of FIG. 10, and FIG. 12 illustrates a cross-sectional view taken along a line XII-XII' of FIG. 10. FIG. 10 illustrates only some components to describe key features of the present inventive concept, and FIG. 11 to FIG. 12 also illustrate virtual cross-sections for describing the main features of the present inventive concept, and do not exactly coincide with cross-sectional lines of FIG. 10.

Referring to FIG. 10, in the case of an exemplary embodiment of FIG. 10, a portion of the first intermetal dielectric VIA1 is removed along the first direction DR1, and the exemplary embodiment of FIG. 10 is identical to the exemplary embodiment of FIG. 5 except that the first intermetal dielectric VIA1 is also removed. A detailed description of same constituent elements will be omitted.

That is, referring to FIG. 10, the first intermetal dielectric VIA1 disposed in regions between adjacent pixel electrodes 191a, 191b and 191c is removed too. Accordingly, the first intermetal dielectric VIA1 includes a plurality of islands patterns as illustrated in FIG. 10.

Referring to FIG. 11, the first intermetal dielectric VIA1 and the second intermetal dielectric VIA2 in regions overlapping the first data conductive layer DE1 and the second data conductive layer DE2 are remained to cover the first data conductive layer DE1 and the second data conductive layer DE2, respectively In FIG. 11, a region NVIA1 in which the first intermetal dielectric VIA1 is removed and a region NVIA2 in which the second intermetal dielectric VIA2 is removed are illustrated by dotted lines.

Referring to FIG. 12, a portion of the first intermetal dielectric VIA1 which does not cover the first data conductive layer DE1 and the first intermetal dielectric VIA1 disposed in regions between the adjacent pixel electrodes 191a, 191b and 191c are removed. In FIG. 12, the region NVIA1 in which the first intermetal dielectric VIA1 is removed is illustrated by a dotted line.

That is, referring to FIG. 10 to FIG. 12, the second intermetal dielectric VIA2 is continuously disposed along the second direction DR2, but the first intermetal dielectric VIA1 is partially disposed only in a region overlapping the first data conductive layer DE1.

Figure 13:
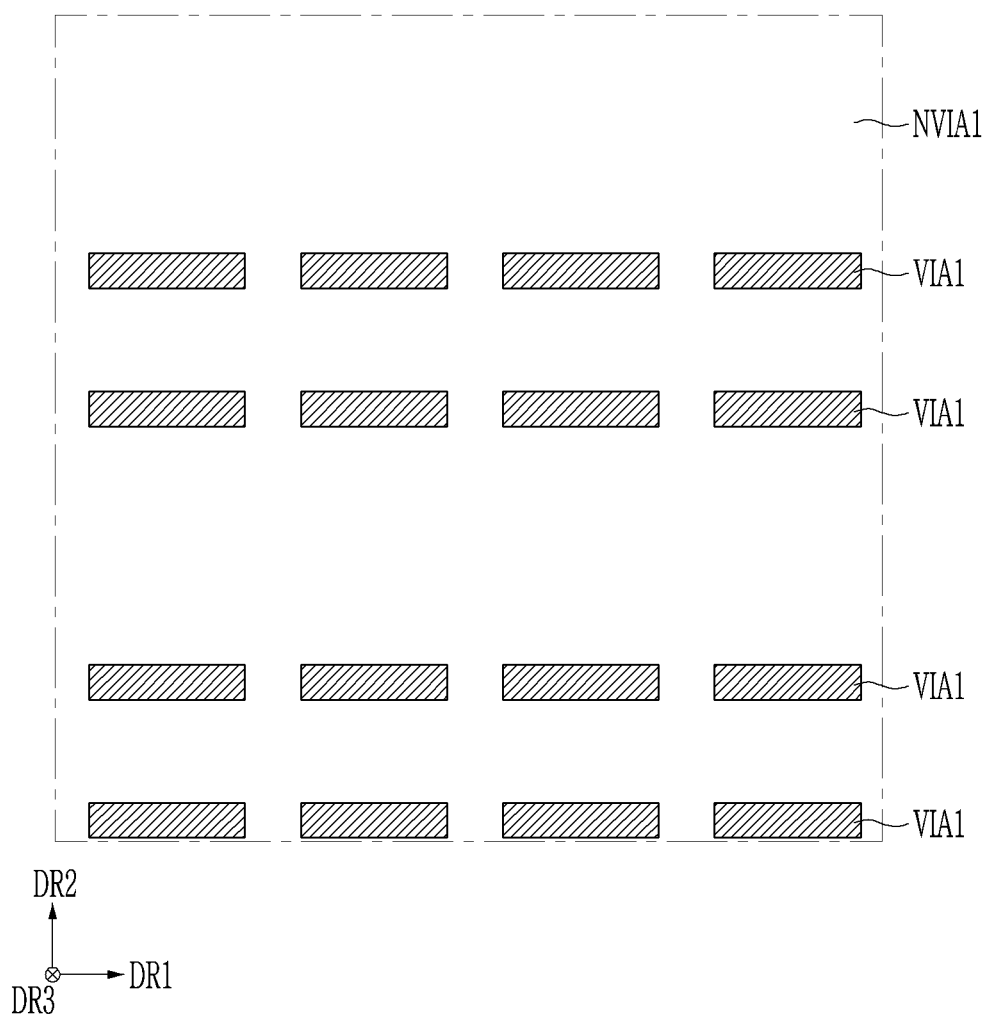
FIG. 13 illustrates a configuration of a first intermetal dielectric disposed in an area displayed in FIG. 10.

FIG. 13 illustrates a configuration of the first intermetal dielectric VIA1 disposed in an area displayed in FIG. 10. In FIG. 10, the first intermetal dielectric VIA1 is illustrated as hatched portions.

Figure 14:
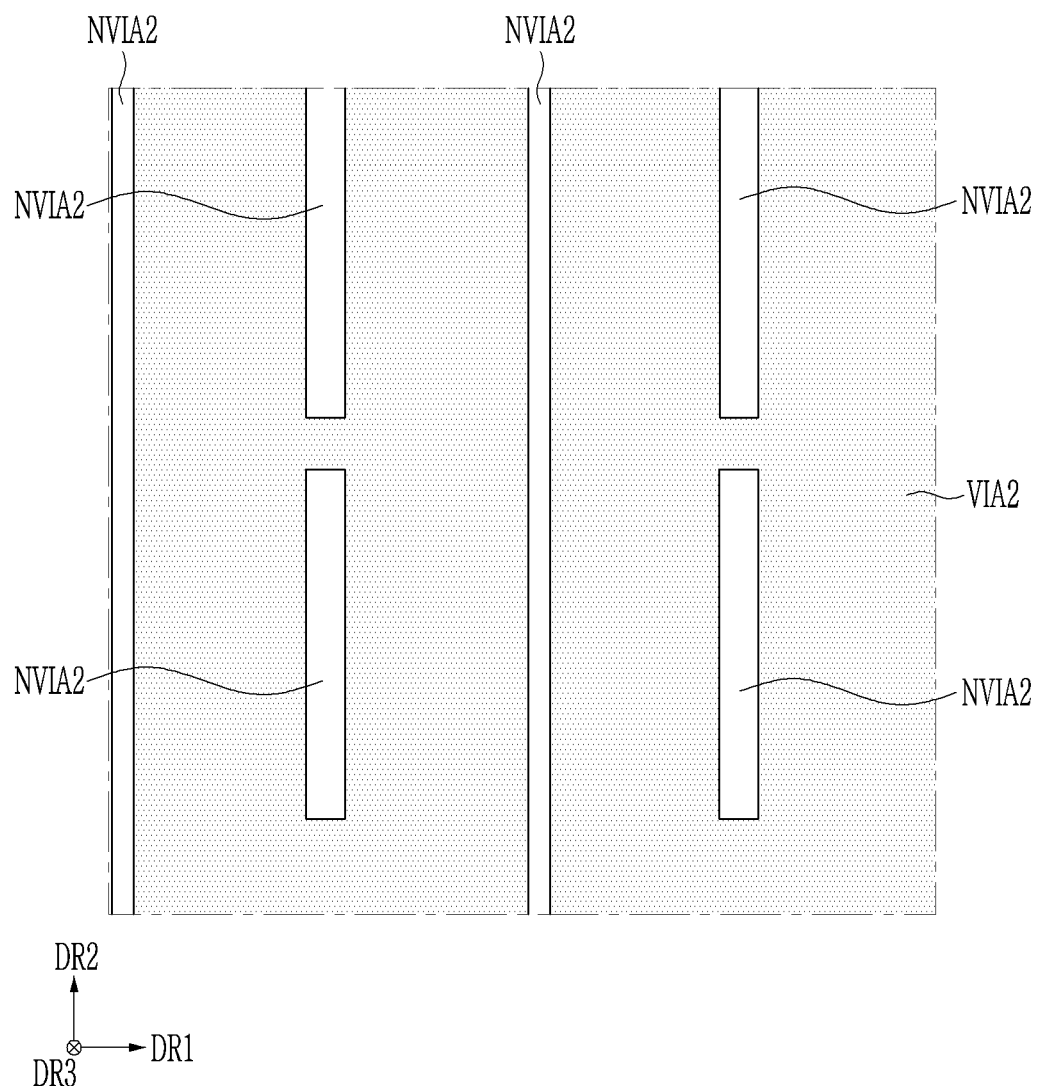
FIG. 14 illustrates a configuration of a second intermetal dielectric disposed in an area displayed in FIG. 10.

Similarly, FIG. 14 illustrates a configuration of the second intermetal dielectric VIA2 disposed in an area displayed in FIG. 10. In FIG. 14, the region in which the first intermetal dielectric VIA2 is disposed is illustrated as hatched portions. The region NVIA2 in which the second intermetal dielectric VIA2 is removed is illustrated without hatching.

Referring to FIG. 10, FIG. 13, and FIG. 14, the second intermetal dielectric VIA2 disposed between the adjacent pixel electrodes 191a, 191b, and 191c is removed along the column direction (the second direction DR2), and the first intermetal dielectric VIA1 is partially disposed only in the region overlapping the first data conductive layer DE1 and is removed in other regions. The first intermetal dielectric VIA1 disposed between the adjacent pixel electrodes 191a, 191b, and 191c is also removed. That is, as illustrated in FIG. 13, the first intermetal dielectric VIA1 may have an island shape in which regions spaced apart from each other are disposed along the first direction DR1.

According to the present exemplary embodiment, an area occupied by the first intermetal dielectric VIA1 and the second intermetal dielectric VIA2 in the entire display device structure is reduced, and accordingly, it is possible to prevent the display device from being deteriorated due to outgas sing from the first intermetal dielectric VIA1 and the second intermetal dielectric VIA2.

Figure 15:
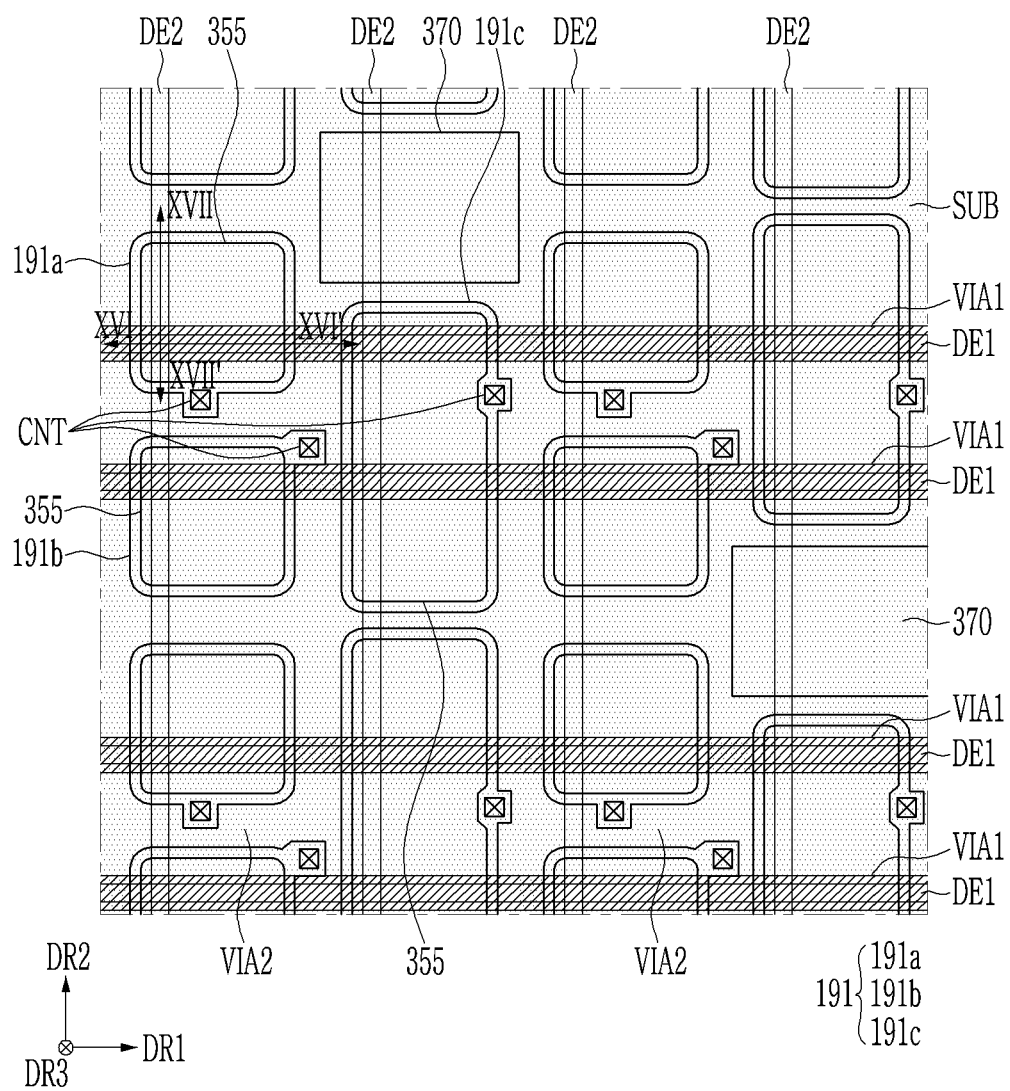
FIG. 15 illustrates a plan view corresponding to that of FIG. 5 for a display device according to another exemplary embodiment.
Figure 16:
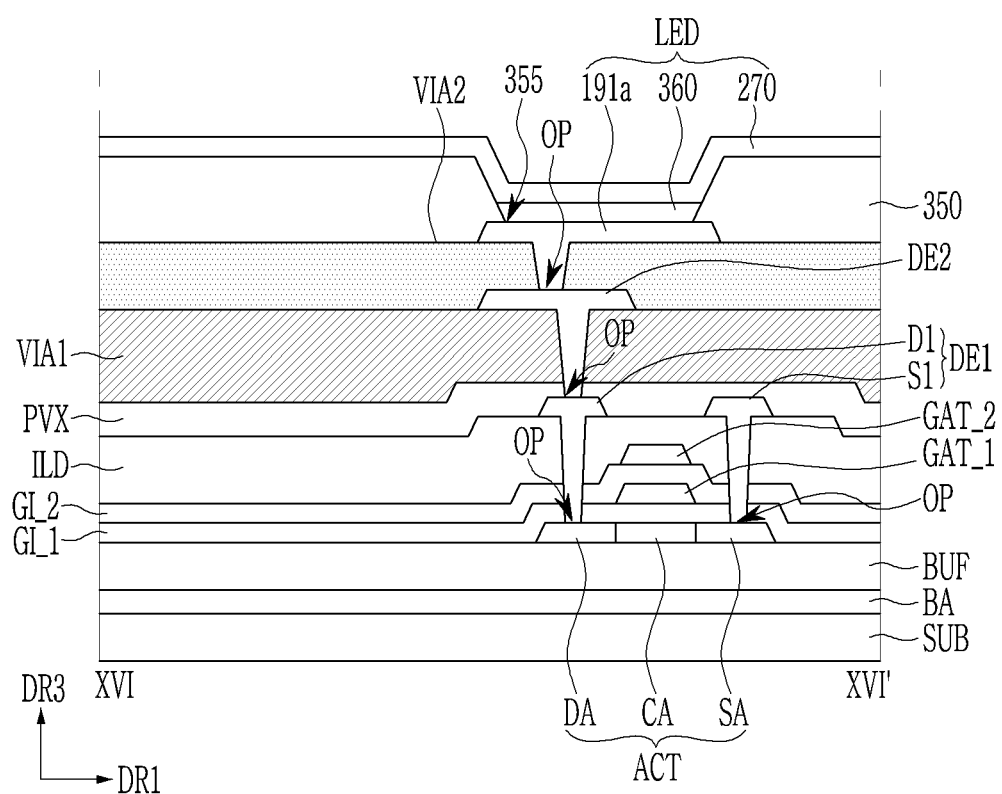
FIG. 16 illustrates a cross-sectional view taken along a line XVI-XVI' of FIG. 15.
Figure 17:
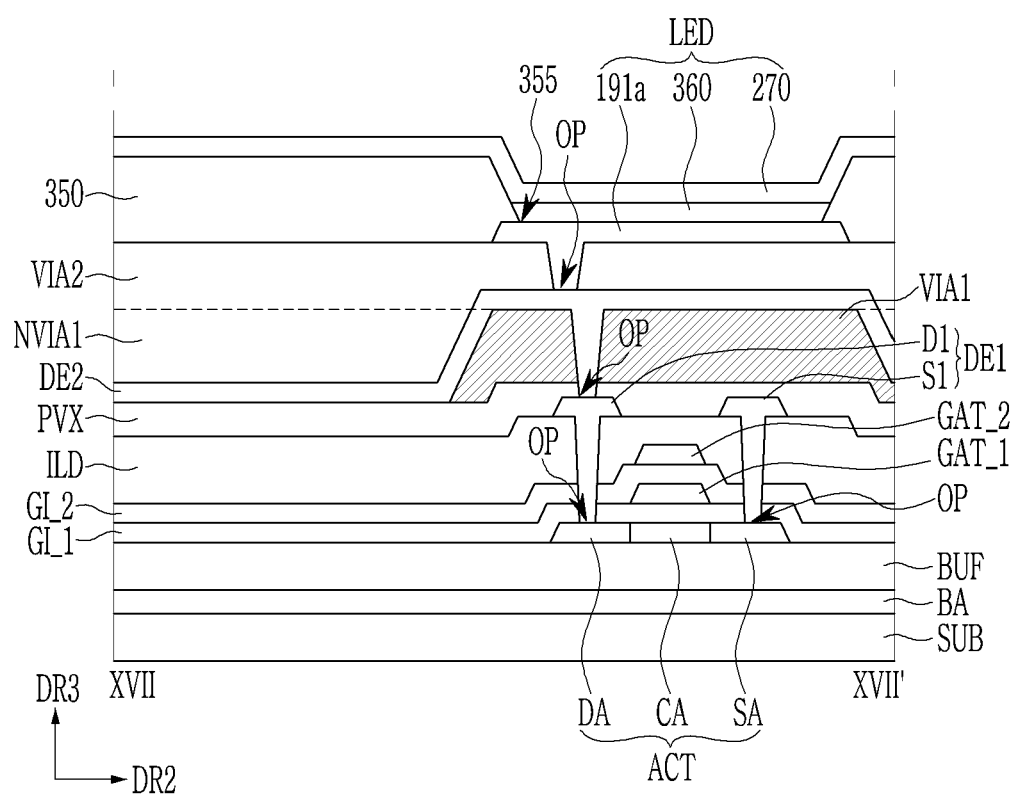
FIG. 17 illustrates a cross-sectional view taken along a line XVII-XVII' of FIG. 5.

FIG. 15 illustrates a plan view corresponding to that of FIG. 5 for a display device according to another exemplary embodiment. FIG. 16 illustrates a cross-sectional view taken along a line XVI-XVI' of FIG. 15, and FIG. 17 illustrates a cross-sectional view taken along a line XVII-XVII' of FIG. 5. FIG. 15 illustrates only some components to describe key features of the present inventive concept, and FIG. 16 and FIG. 17 also illustrate virtual cross-sections for describing the main features of the present inventive concept, and do not exactly coincide with a cross-sectional line of FIG. 15.

Referring to FIG. 15, the exemplary embodiment of FIG. 15 is identical to the exemplary embodiment of FIG. 5 except that a configuration of the second intermetal dielectric VIA2. A detailed description of same constituent elements will be omitted.

Referring to FIG. 16 and FIG. 17, the first intermetal dielectric VIA1 is disposed only in the region where the first data conductive layer DE1 is disposed and is removed in the other regions, but the second intermetal dielectric VIA2 may not be removed in an entire region.

Figure 18:
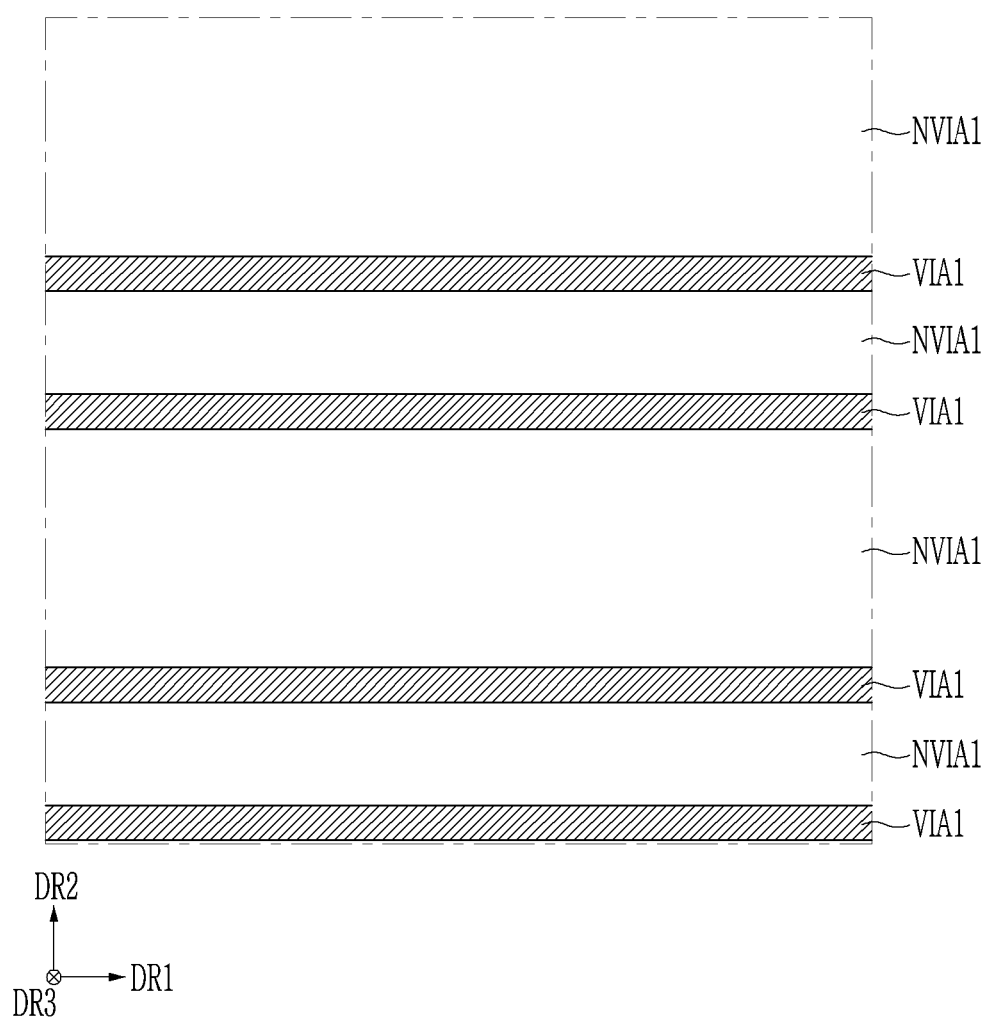
FIG. 18 illustrates a configuration of a first intermetal dielectric disposed in an area displayed in FIG. 15.

FIG. 18 illustrates a configuration of the first intermetal dielectric VIA1 disposed in an area displayed in FIG. 15. In FIG. 18, the first intermetal dielectric VIA1 is illustrated as hatched portions. The region NVIA1 in which the first intermetal dielectric VIA1 is removed is illustrated without hatching.

Figure 19:
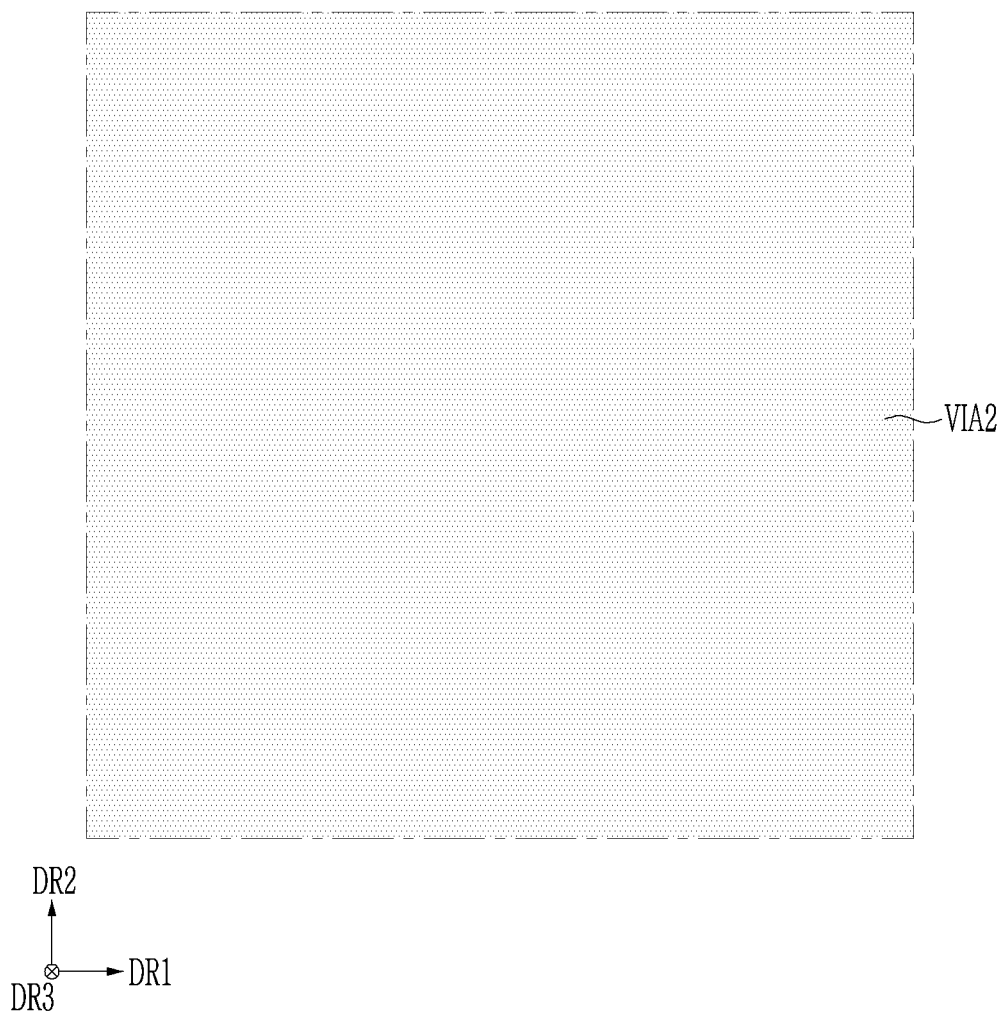
FIG. 19 illustrates the second intermetal dielectric disposed in the area displayed in FIG. 15.

Similarly, FIG. 19 illustrates the second intermetal dielectric disposed in the area displayed in FIG. 15. The second intermetal dielectric VIA2 is not removed and is disposed in the entire region.

Figure 20:
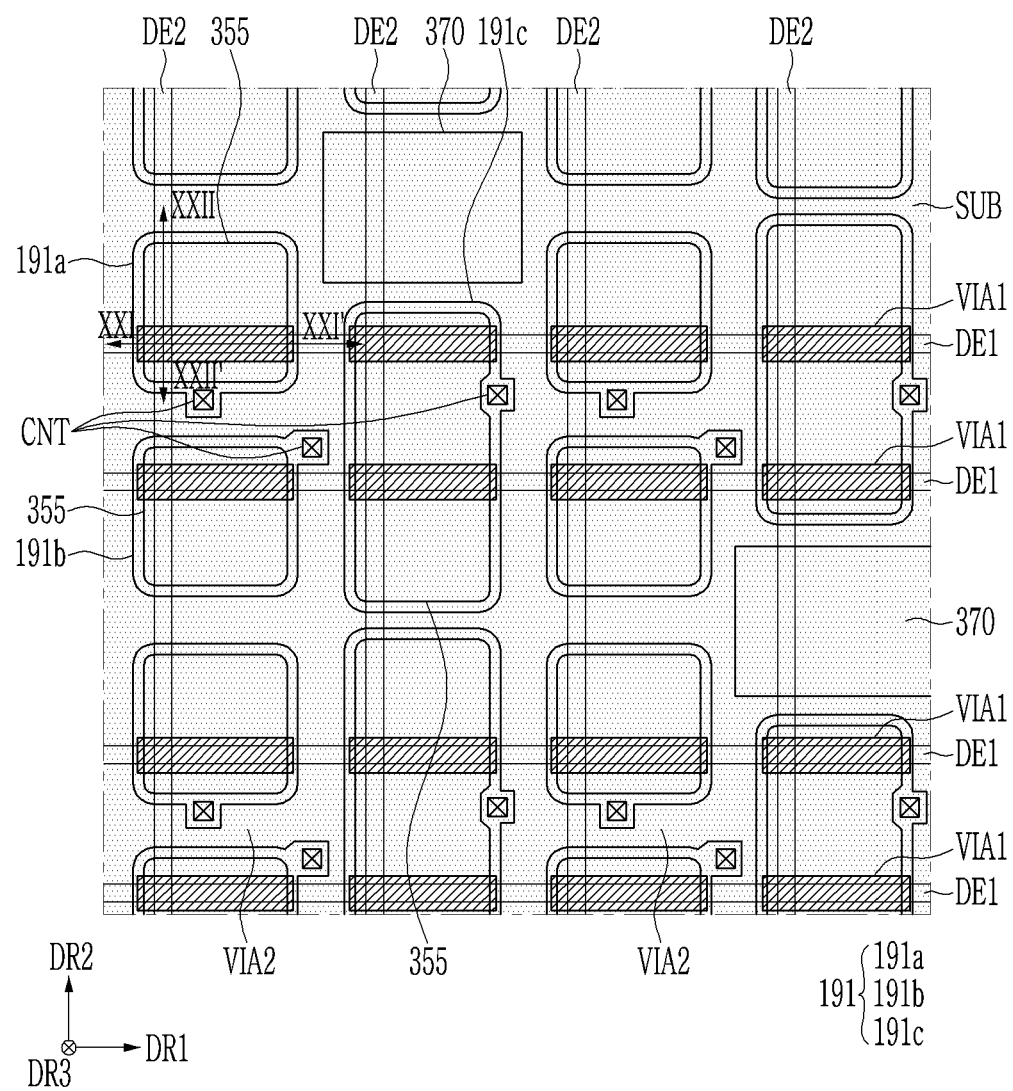
FIG. 20 illustrates a plan view corresponding to that of FIG. 10 for a display device according to another exemplary embodiment.
Figure 21:
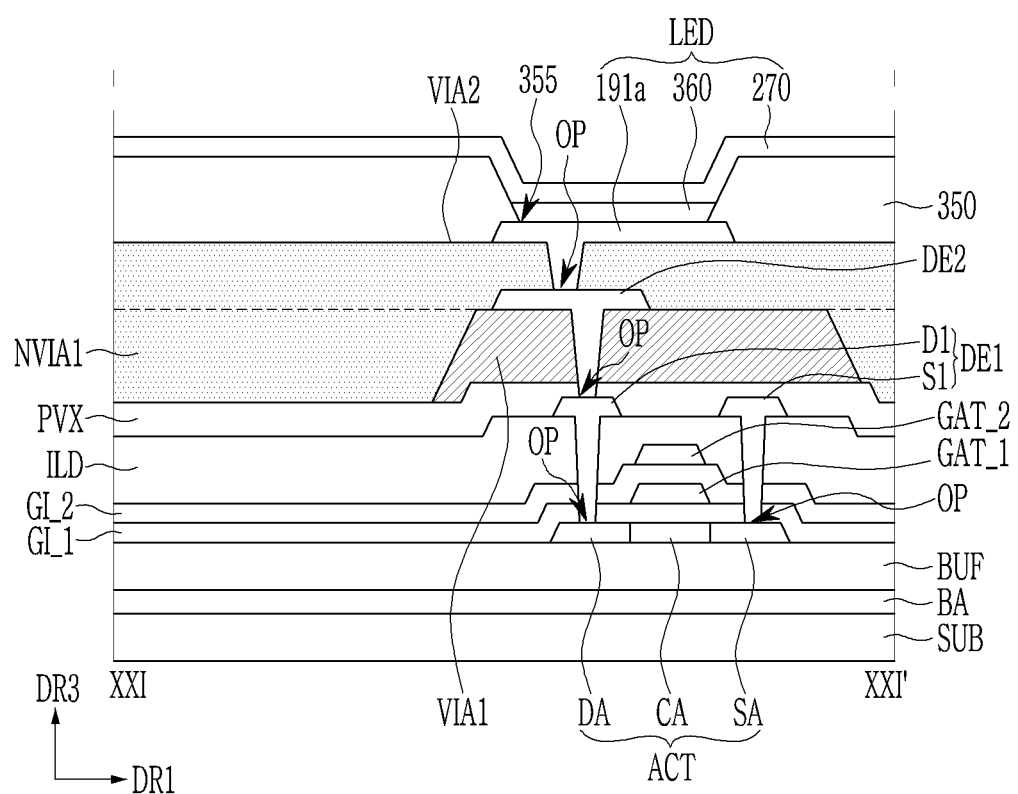
FIG. 21 illustrates a cross-sectional view taken along a line XXI-XXI' of FIG. 20.
Figure 22:
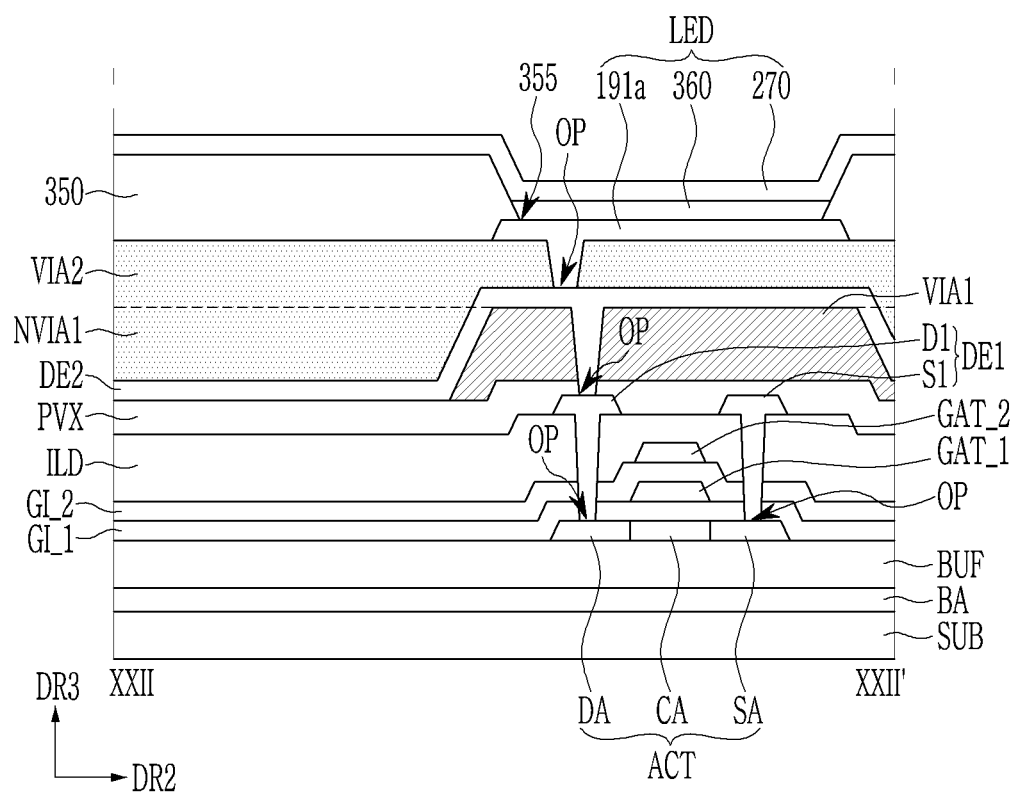
FIG. 22 illustrates a cross-sectional view taken along a line XXII-XXII' of FIG. 20.

FIG. 20 illustrates a plan view corresponding to that of FIG. 10 for a display device according to another exemplary embodiment. FIG. 21 illustrates a cross-sectional view taken along a line XXI-XXI' of FIG. 20, and FIG. 22 illustrates a cross-sectional view taken along a line XXII-XXII' of FIG. 20. FIG. 20 illustrates only some components to describe key features of the present inventive concept, and FIG. 21 to FIG. 22 also illustrate virtual cross-sections for describing the main features of the present inventive concept, and do not exactly coincide with cross-sectional lines of FIG. 20.

Referring to FIG. 20, the exemplary embodiment of FIG. 20 is identical to the exemplary embodiment of FIG. 10 except that a portion of the second intermetal dielectric VIA2 is not removed. A detailed description of same constituent elements will be omitted.

Referring to FIG. 21 and FIG. 22, the first intermetal dielectric VIA1 is partially disposed only in the region where the first data conductive layer DE1 is disposed and is removed in the other regions, but the second intermetal dielectric VIA2 may not be removed in an entire region.

Figure 23:
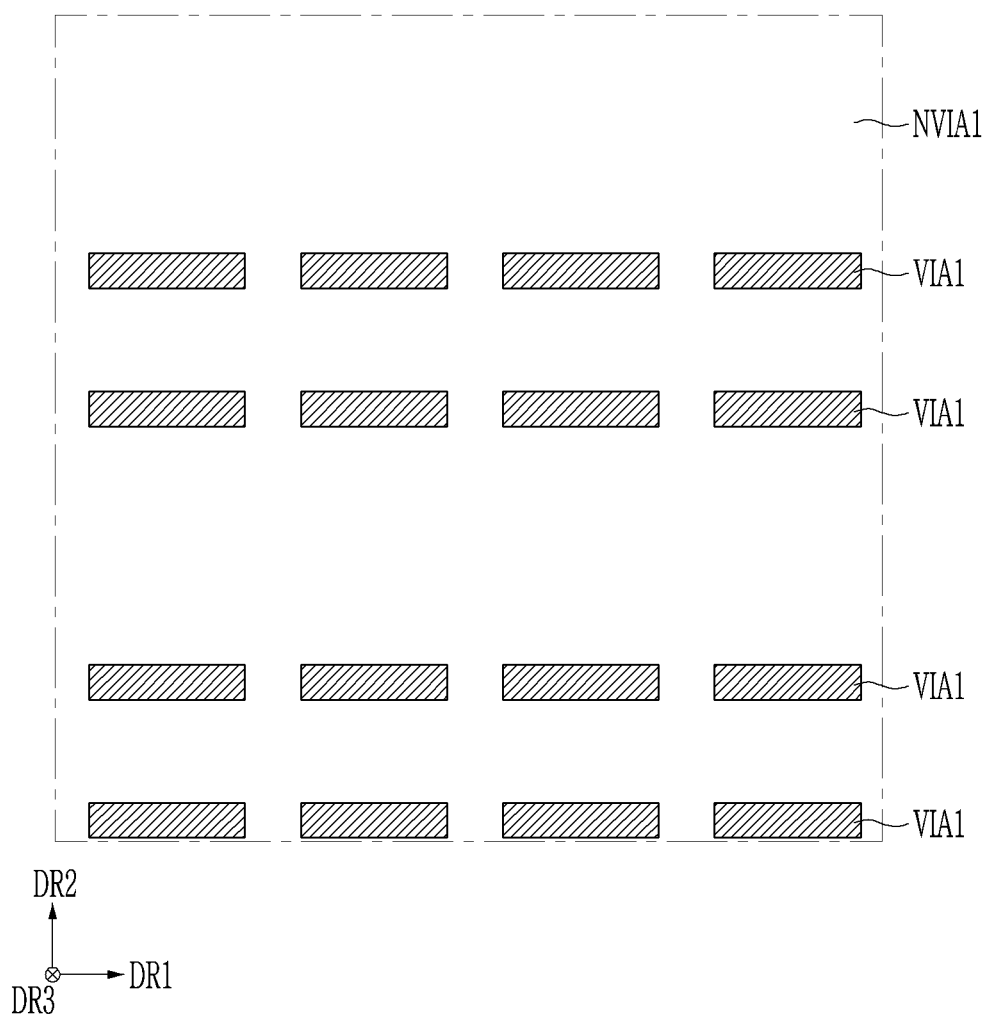
FIG. 23 illustrates a configuration of a first intermetal dielectric disposed in an area displayed in FIG. 20.

FIG. 23 illustrates a configuration of the first intermetal dielectric VIA1 disposed in an area displayed in FIG. 20. In FIG. 23, the first intermetal dielectric VIA1 is illustrated as hatched portions. The region NVIA1 in which the first intermetal dielectric VIA1 is removed is illustrated without hatching.

Figure 24:
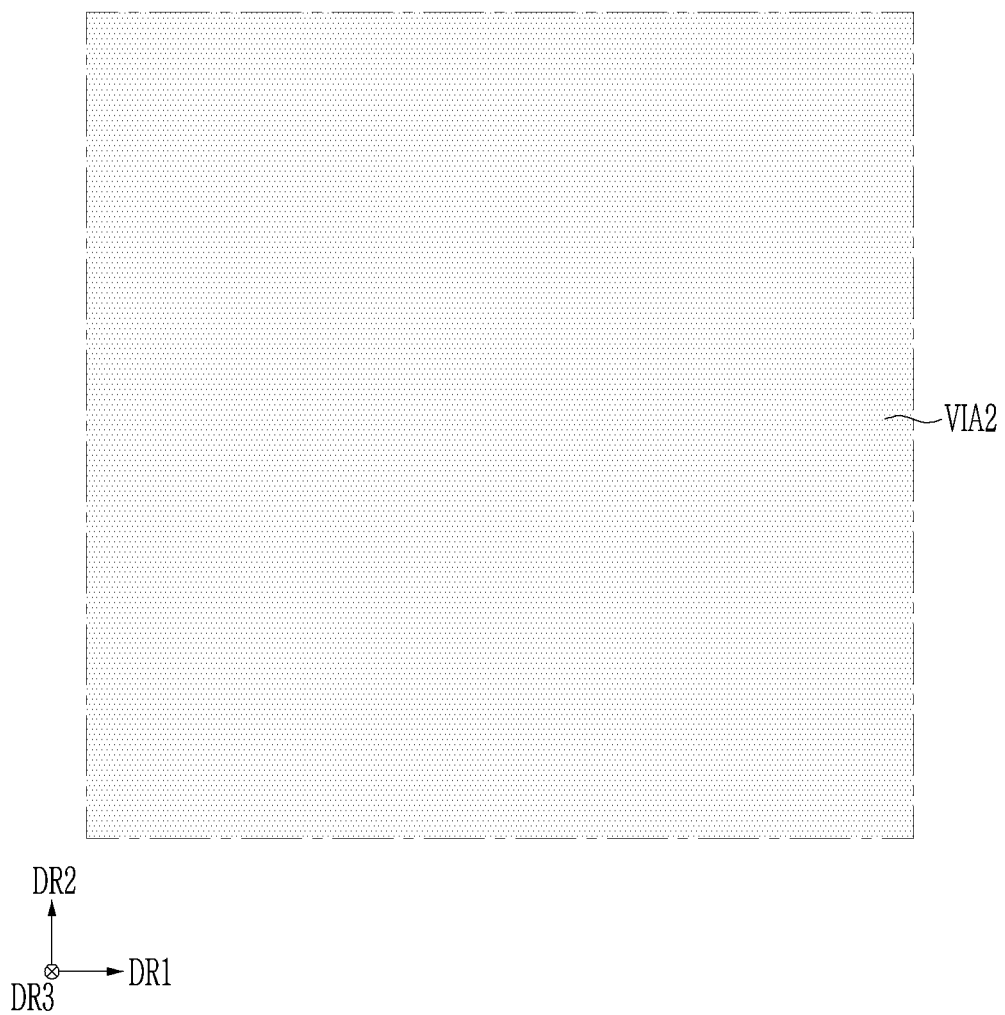
FIG. 24 illustrates the second intermetal dielectric disposed in the area displayed in FIG. 20.

Similarly, FIG. 24 illustrates the second intermetal dielectric disposed in the area displayed in FIG. 20. The second intermetal dielectric VIA2 is not removed and is disposed in the entire region.

As described above, the first intermetal dielectric VIA1 is partially removed, and the second intermetal dielectric VIA2 is not removed in the exemplary embodiment of FIG. 15 to FIG. 19 and the exemplary embodiment of FIG. 20 to FIG. 24. Even in this exemplary embodiment, as in the previous exemplary embodiment, since a volume occupied by the intermetal dielectric in the display device is reduced, it is possible to prevent the display device from being deteriorated due to outgas sing.

In the case of FIG. 1 to FIG. 24, the exemplary embodiment in which the first intermetal dielectric VIA1 or the second intermetal dielectric VIA2 is removed from a pixel in the display area of the display device has been described. However, the first intermetal dielectric VIA1 and the second intermetal dielectric VIA2 may be removed even within a dummy pixel area that does not display an image and a non-display portion in which a driver is disposed, in the display device.

Figure 25:
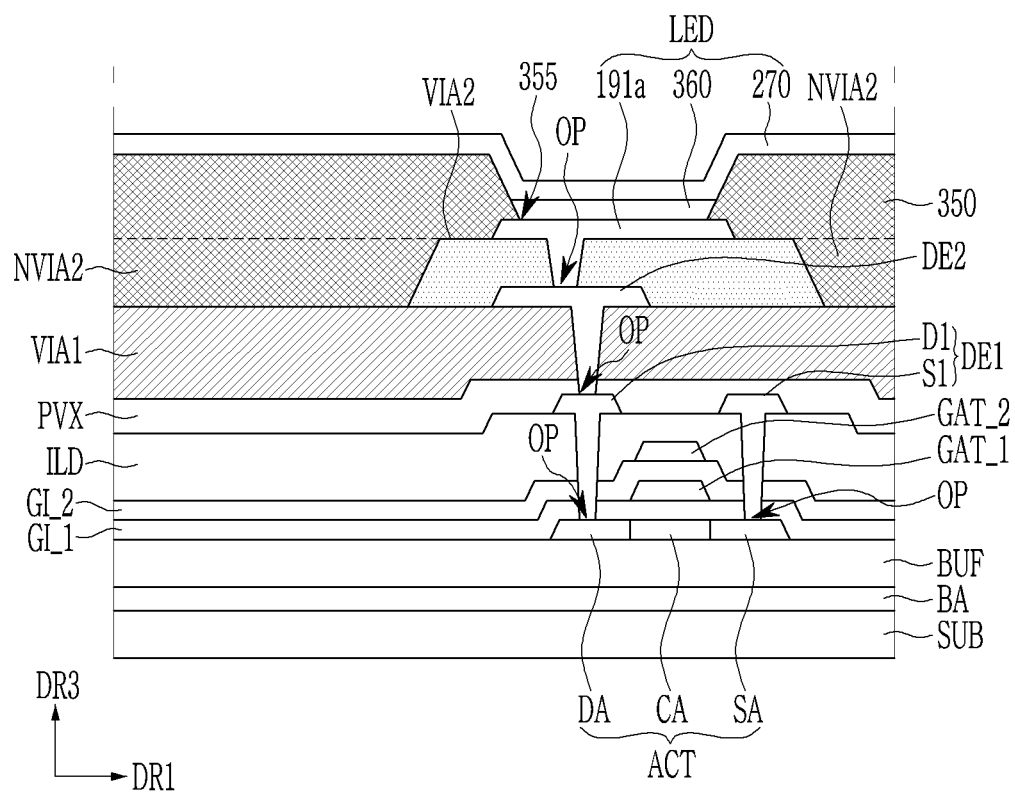
FIG. 25 illustrates a display area DIA and a non-display area NDA of the display device separately.
Figure 26:
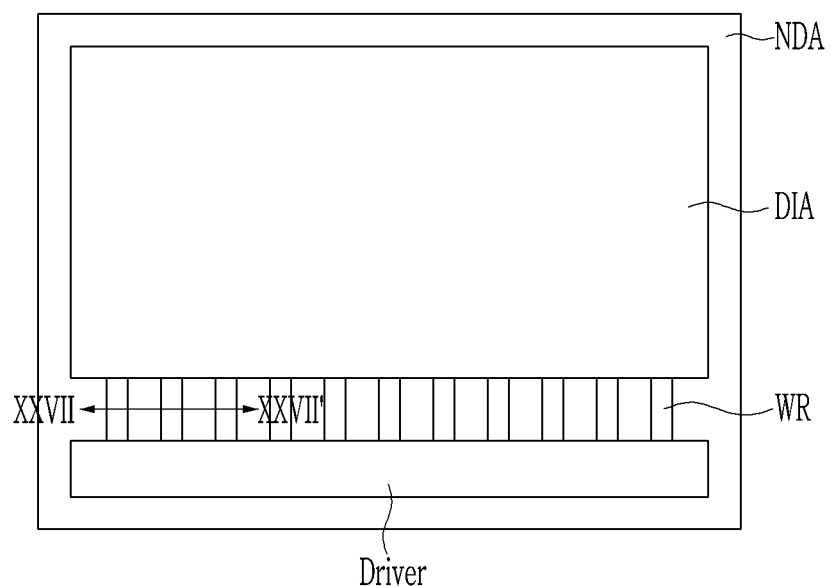
FIG. 26 illustrates a cross-sectional view taken along a line XXVI-XXVI' of FIG. 25.

FIG. 25 illustrates a display area DIA and a non-display area NDA of the display device separately. FIG. 26 illustrates a cross-sectional view taken along a line XXVI-XXVI' of FIG. 25.

Referring to FIG. 25, a driver is disposed in the non-display area NDA, and the driver and the display area DIA are connected by a plurality of wires WR.

Referring to FIG. 26, the wires WR may include a first data conductive layer DE1 and a second data conductive layer DE2, and a first intermetal dielectric VIA1 may be disposed therebetween. That is, similar to a stacked structure of the display area DIA described above, the non-display area NDA may include the substrate SUB, the barrier layer BA, the buffer layer BUF, the first gate insulating layer GI_1, the second gate insulating layer GI_2, and the interlayer insulating layer ILD. A detailed description of same constituent elements will be omitted. The first data conductive layer DE1 in the non-display area NDA may be connected to the first data conductive layer DE1 in the display area DIA.

A passivation layer PVX may be disposed on the first data conductive layer DE1. The passivation layer PVX may be omitted according to an exemplary embodiment.

A first intermetal dielectric VIA1 may be disposed on the passivation layer PVX. As illustrated in FIG. 26, the first intermetal dielectric VIA1 may be removed in a region where the first data conductive layer DE1 is not disposed (NVIA1).

The second data conductive layer DE2 may be disposed on the first intermetal dielectric VIA1. The second data conductive layer DE2 in the non-display area NDA may be connected to the second data conductive layer DE2 in the display area DIA.

A second intermetal dielectric VIA2 may be disposed on the second data conductive layer DE2. In FIG. 26, a configuration where the second intermetal dielectric VIA2 is not removed is illustrated, but according to an exemplary embodiment, the second intermetal dielectric VIA2 may be removed in a region that does not cover the second data conductive layer DE2.

That is, the first intermetal dielectric VIA1 and the second intermetal dielectric VIA2 may be removed not only in the display area DIA but also in the non-display area NDA of the display device.

Hereinafter, materials and thicknesses of the first intermetal dielectric VIA1 and the second intermetal dielectric VIA2, and a material of the partition wall 350 in various exemplary embodiments of the present inventive concept, will be described in detail with reference to FIG. 27.

Figure 27:
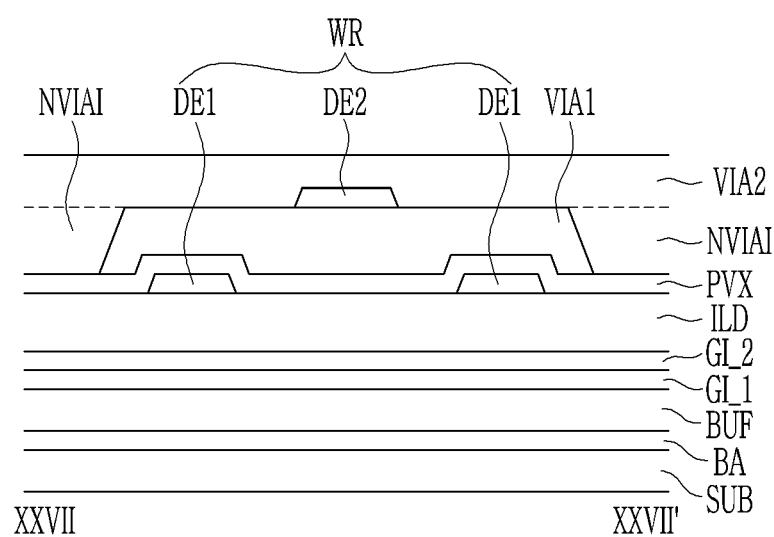
FIG. 27 illustrates a cross-sectional view of a display device according to an exemplary embodiment.

FIG. 27 illustrates a cross-sectional view of a display device according to an exemplary embodiment.

Contents of the first intermetal dielectric VIA1 and the second intermetal dielectric VIA2 described in FIG. 27 may be applied to all the exemplary embodiments of FIG. 1 to FIG. 26 described above.

In an exemplary embodiment, each of the thicknesses of the first intermetal dielectric VIA1 and the second intermetal dielectric VIA2 may be in a range of 10,000 Å to 16,000 Å. This is a numerical range capable of minimizing an amount of outgassing in the first intermetal dielectric VIA1 and the second intermetal dielectric VIA2. When the thicknesses of the first intermetal dielectric VIA1 and the second intermetal dielectric VIA2 are 16,000 Å or more, a lot of outgassing may occur, and when the thicknesses of the first intermetal dielectric VIA1 and the second intermetal dielectric VIA2 is 10,000 Å or less, each intermetal dielectric may not have a sufficient planarization property.

The first intermetal dielectric VIA1 and the second intermetal dielectric VIA2 may include a photoresist PAC. The photoresist PAC in the first intermetal dielectric VIA1 and the second intermetal dielectric VIA2 may be decomposed by external light and release gas which is called outgas sing.

Such outgassing causes shrinkage and deformation of the display device, resulting in poor reliability. The first intermetal dielectric VIA1 and the second intermetal dielectric VIA2 according to an exemplary embodiment may have a content of the photoresist PAC of 60% or less with compared to a typical display device. Accordingly, outgassing may be minimized.

In addition, the first intermetal dielectric VIA1 and the second intermetal dielectric VIA2 may include an outgas capture unit. The outgas capture unit can capture outgas generated in an organic layer.

In addition, the first intermetal dielectric VIA1 and the second intermetal dielectric VIA2 may include a siloxane-based material. The siloxane-based organic layer release less outgassing than a polyimide-based or acryl-based organic layer. Accordingly, outgassing may be minimized.

In addition, at least one of the first intermetal dielectric VIA1 and the second intermetal dielectric VIA2 may include a black material. The outgassing of the organic layer may be occurred when the organic layer is exposure to light, and when the first intermetal dielectric VIA1 or the second intermetal dielectric VIA2 includes a black material, external light may be blocked by the black material in the first intermetal dielectric VIA1 or the second intermetal dielectric VIA2, thereby reducing an outgas sing amount.

In an exemplary embodiment, the partition wall 350 may also include a black material. As illustrated in FIG. 27, when the partition wall 350 includes a black material, it is possible to block the external light not to incident onto the first intermetal dielectric VIA1 and the second intermetal dielectric VIA2, and to reduce outgassing.

Hereinafter, a structure of a display device according to an exemplary embodiment will be described in detail through a specific layout view and a cross-sectional view. However, this is only an example, and the structure of the present inventive concept is not limited thereto.

Figure 28:
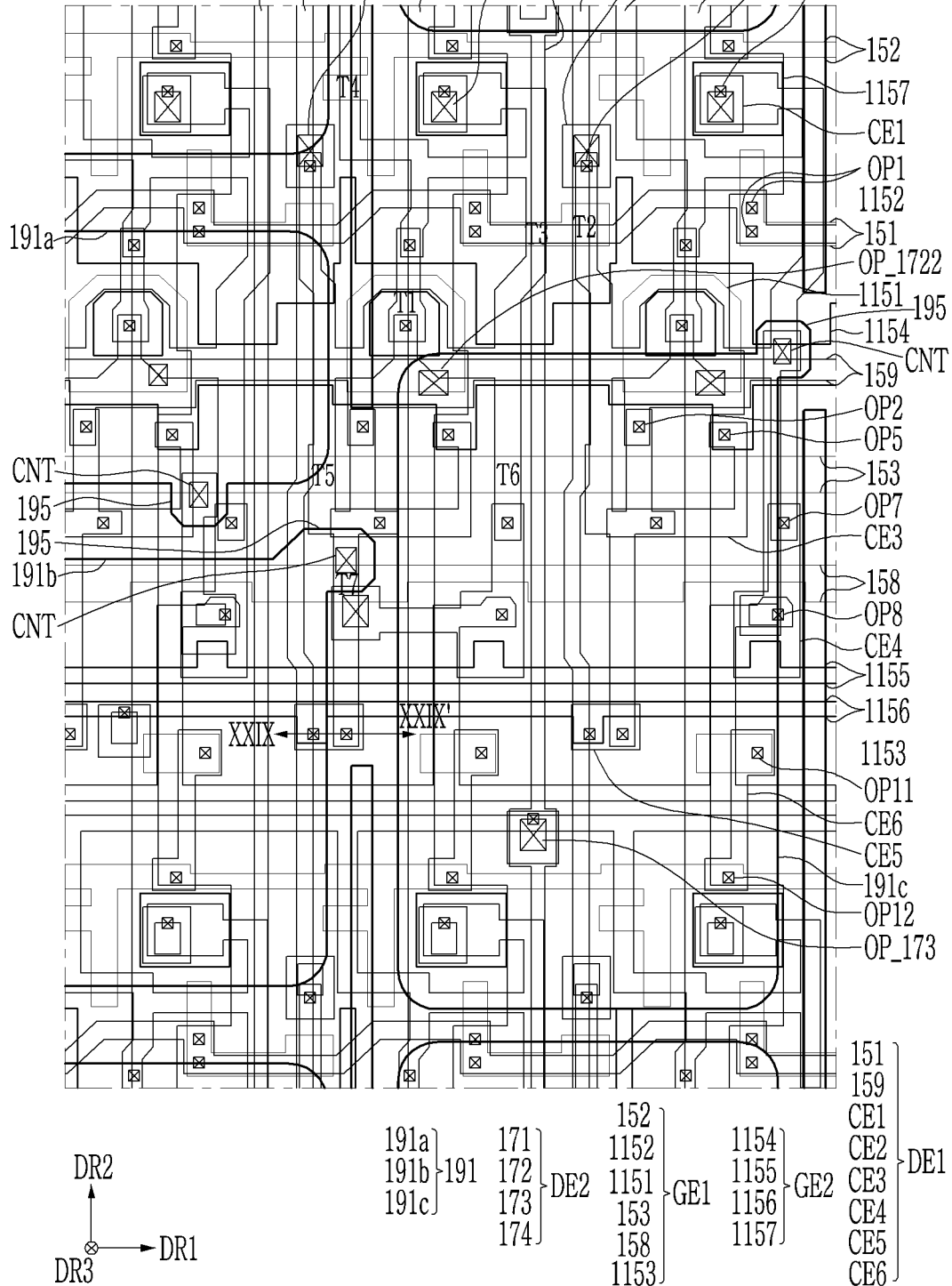
FIG. 28 illustrates a layout view of a display device according to an exemplary embodiment of the present inventive concept.
Figure 29:
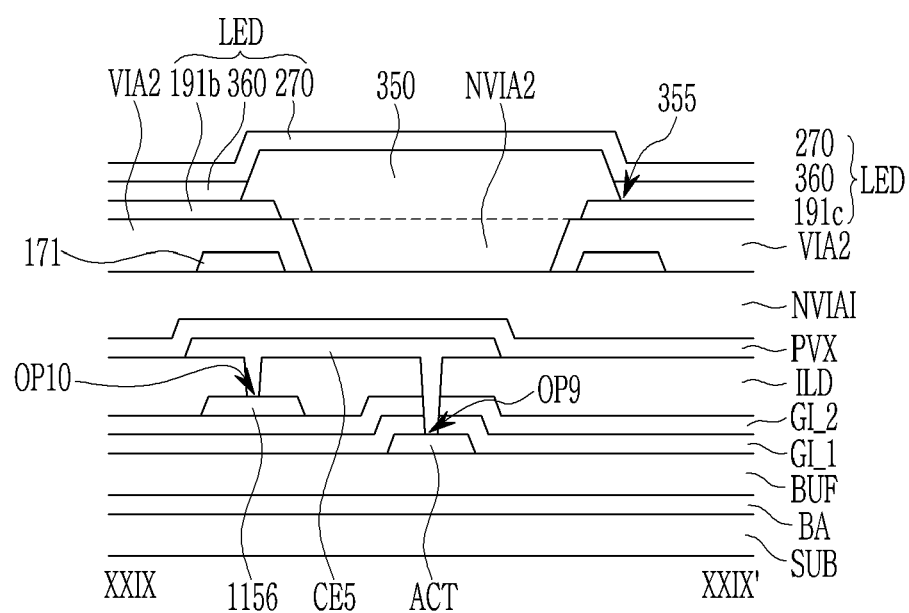
FIG. 29 illustrates a cross-sectional view taken along a line XXIX-XXIX' of FIG. 28.

FIG. 28 illustrates a layout view of a display device according to an exemplary embodiment of the present inventive concept. FIG. 29 illustrates a cross-sectional view taken along a line XXIX-XXIX' of FIG. 28. FIG. 30 to FIG. 34 illustrate a structure disposed at a same layer in the display device of FIG. 28.

Referring to FIG. 28 and FIG. 29, the barrier layer BA and the buffer layer BUF may be sequentially disposed on the substrate SUB. The barrier layer BA and the buffer layer BUF may each include an inorganic insulating material such as a silicon nitride (SiNx), a silicon oxide (SiOx), and a silicon oxynitride (SiOxNy), and may have a single layer or multilayer structure of the material.

Figure 30:
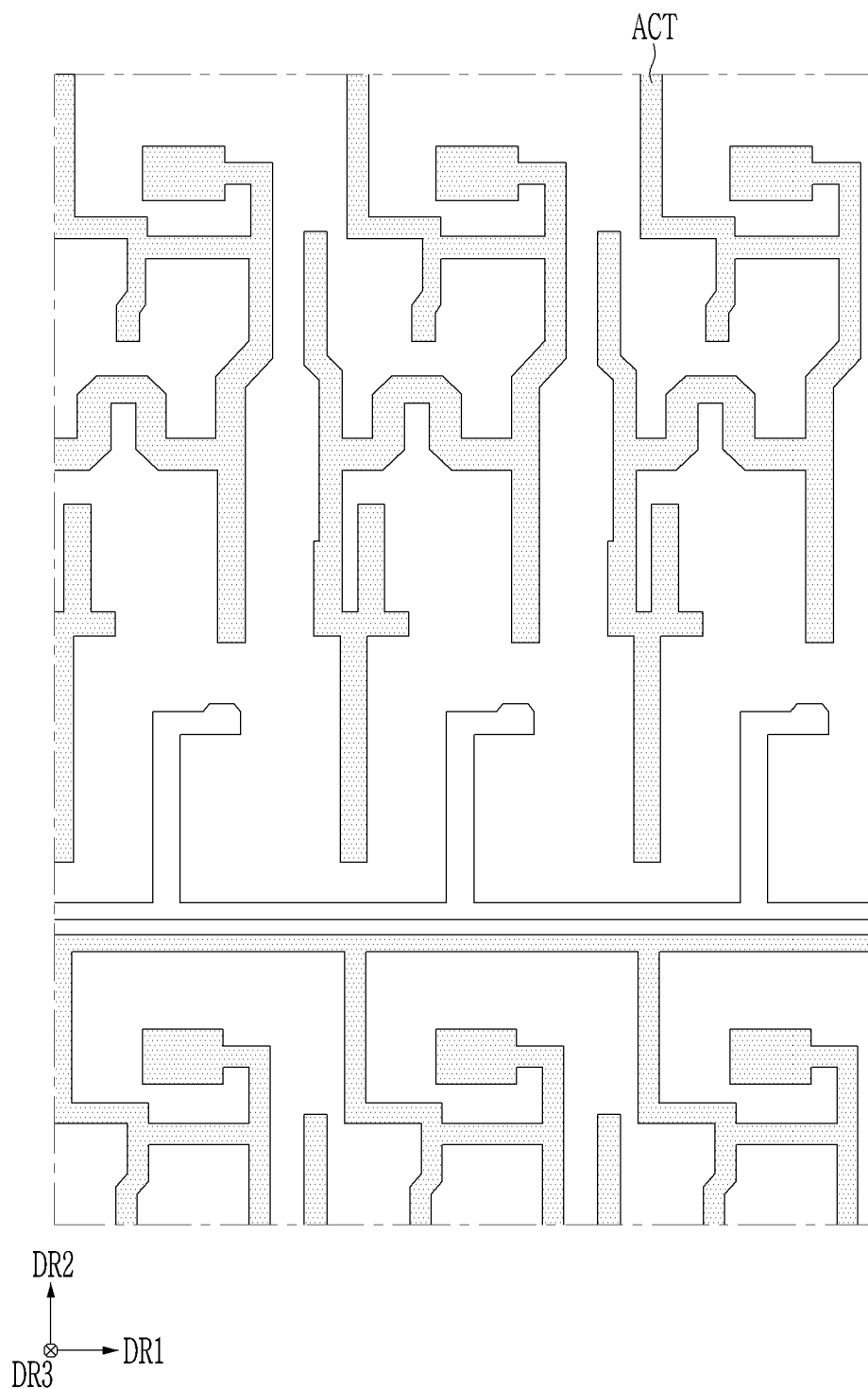
FIG. 30, 31, 32, 33 and FIG. 34 illustrate a structure disposed at a same layer in the display device of FIG. 28.

Next, referring to FIG. 28, FIG. 29, and FIG. 30, the semiconductor layer ACT may be disposed on the buffer layer BUF. The semiconductor layer ACT may include any one of amorphous silicon, polycrystalline silicon, and an oxide semiconductor.

Referring to FIG. 29, a first gate insulating layer GI_1 may be disposed on the semiconductor layer ACT.

Figure 31:
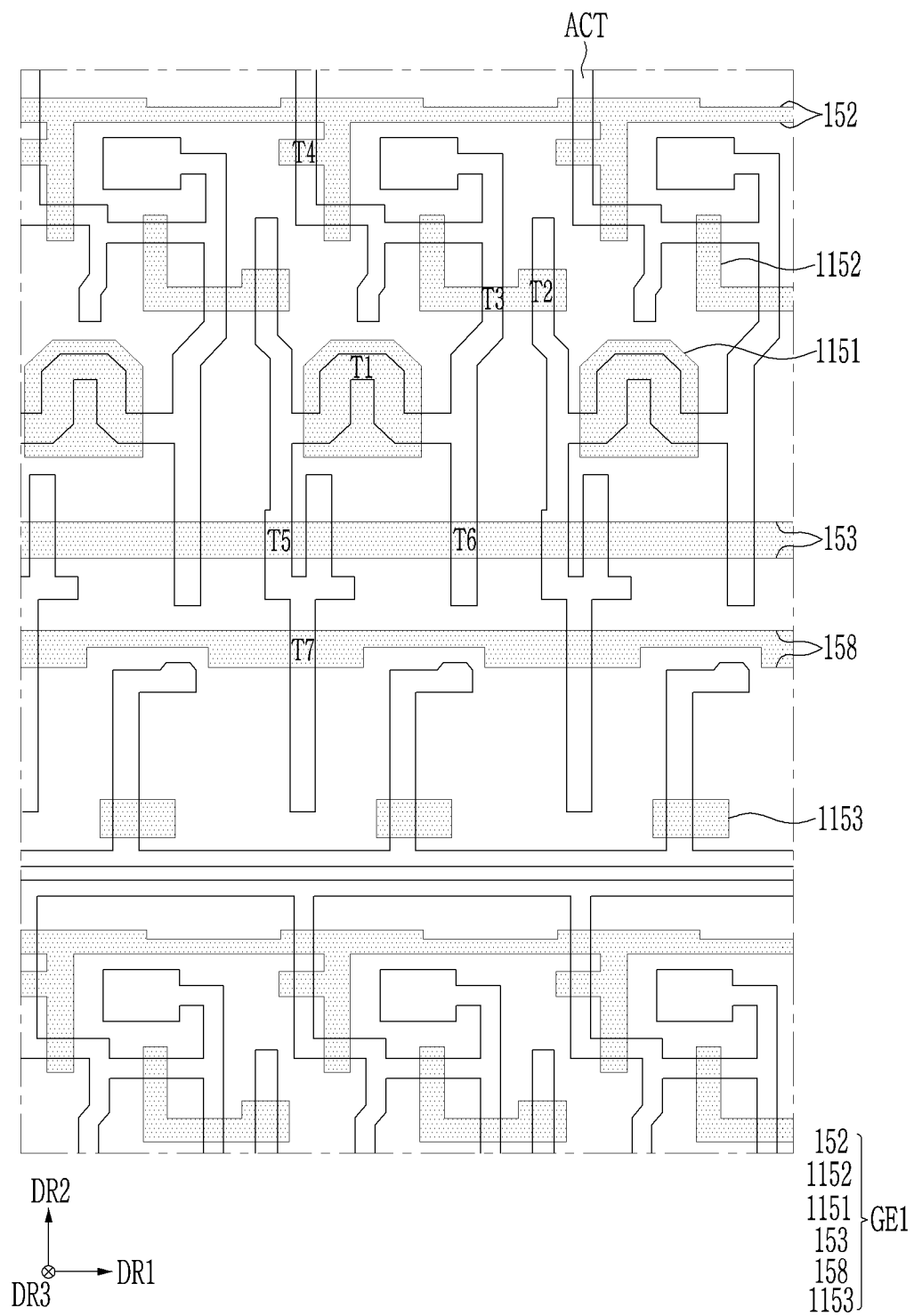

Next, referring to FIG. 28, FIG. 29, and FIG. 31, a first gate conductive layer GE1 may be disposed on the first gate insulating layer GI_1. The first gate conductive layer GE1 may include a first gate electrode 1151, a second gate electrode 1152, a gate pattern 1153, a previous-stage scan line 152, an emission control line 153, and an auxiliary emission line 158.

The semiconductor layer ACT overlapping the first gate electrode 1151 constitute a first transistor T1, and the semiconductor layer ACT overlapping the second gate electrode 1152 may constitute a second transistor T2 and a third transistor T3. The previous-stage scan line 152, the emission control line 153, and the auxiliary emission line 158 may be disposed in parallel with the first direction DR1. A region of the semiconductor layer (ACT) overlapping the previous-stage scan line 152 may constitute a fourth transistor T4.

The previous-stage scan line 152 may transfer a previous-stage scan signal applied to a pixel PX disposed at a previous stage to the fourth transistor T4.

A region of the semiconductor layer ACT overlapping the emission control line 153 may constitute a fifth transistor T5 and a sixth transistor T6. The emission control line 153 may be connected to an emission controller and may transfer an emission control signal EM for controlling an emission time of a light emitting diode to the fifth transistor T5 and the sixth transistor T6.

A region of the semiconductor layer ACT overlapping the auxiliary emission line 158 may constitute a seventh transistor T7.

Next, referring to FIG. 29, a second gate insulating layer GI_2 may be disposed on the first gate conductive layer GE1.

Figure 32:
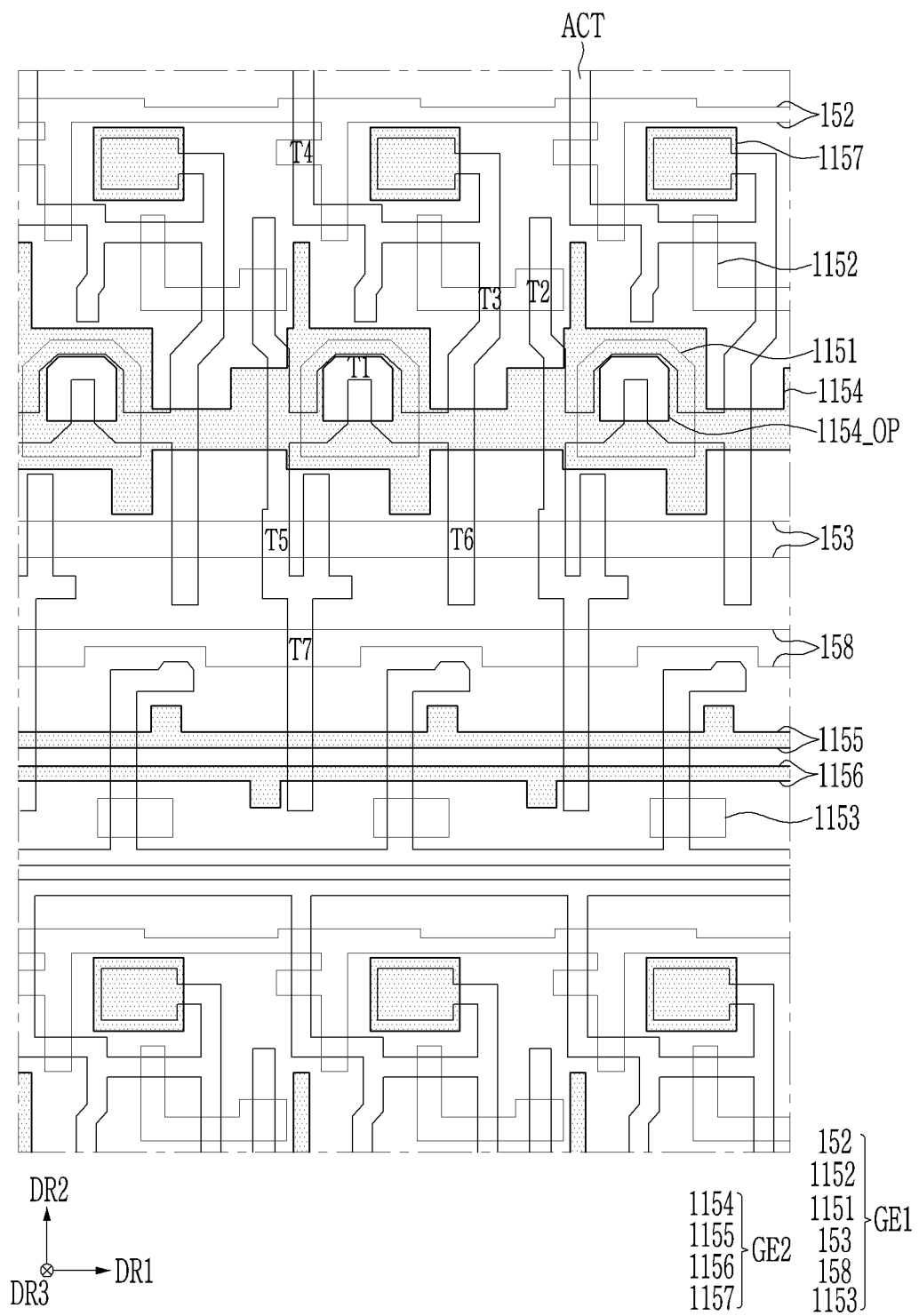

Then, referring to FIG. 32, a second gate conductive layer GE2 may be disposed on the second gate insulating layer GI_2. The second gate conductive layer GE2 includes a storage electrode line 1154 disposed along the first direction DR1, a repair line 1155, a Vsus line 1156, and a gate connection electrode 1157 disposed to have an island shape.

The storage electrode line 1154 may be disposed along the first direction DR1, and may be disposed to overlap the first gate electrode 1151 in a plan view. The storage electrode line 1154 may include a storage electrode opening 1154_OP.

The repair line 1155 may be disposed along the first direction DR1. The Vsus line 1156 may also be disposed along the first direction DR1 in parallel with the repair line 1155.

The connection electrode 1157 may overlap a portion of the semiconductor layer ACT and have an island shape. The gate connection electrode 1157 may constitute a capacitor with the first connection electrode CE1 to be formed later.

Referring back to FIG. 29, an interlayer insulating layer ILD is disposed on the second gate conductive layer GE2.

Figure 33:
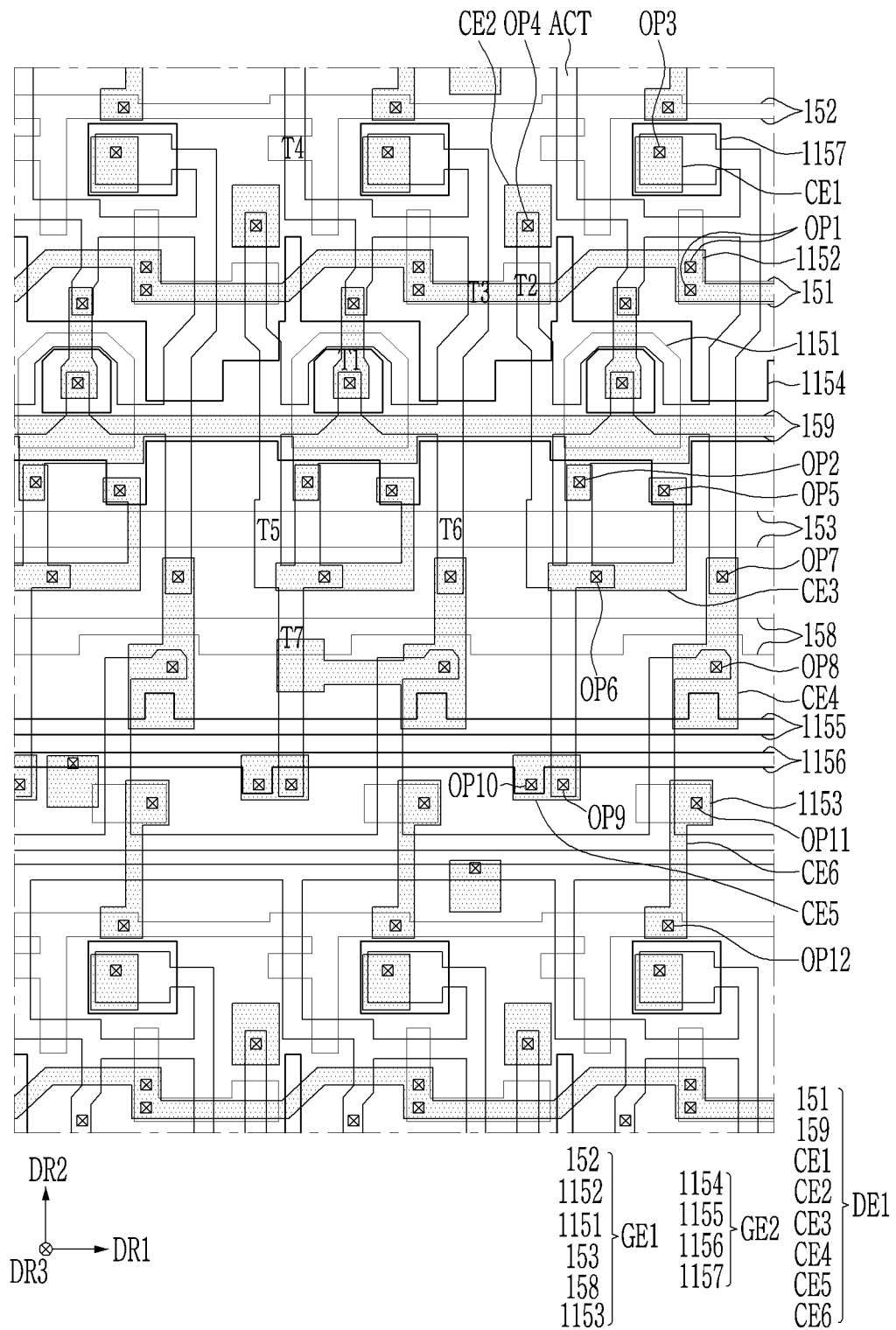

Next, referring to FIG. 28, FIG. 29, and FIG. 33, a first data conductive layer DE1 may be disposed on the interlayer insulating layer ILD.

Referring to FIG. 33, the first data conductive layer DE1 includes a scan line 151 disposed along the first direction, an auxiliary line 159, a first connection electrode CE1 having an island shape, a second connection electrode CE2, a third connection electrode CE3, a fourth connection electrode CE4, a fifth connection electrode CE5, and a sixth connection electrode CE6.

The first scan line 151 may transfer a scan signal Sn to the second transistor T2 and the third transistor T3. The first scan line 151 may be connected to the second gate electrode 1152 through a first opening OP1.

The first connection electrode CE1 may be disposed to overlap the gate connection electrode 1157 in a plan view. The first connection electrode CE1 is connected to the semiconductor layer ACT through a third opening OP3.

The second connection electrode CE2 may be connected to the semiconductor layer ACT through a fourth opening OP4.

The third connection electrode CE3 may be connected to the storage electrode line 1154 through a fifth opening OP5, and may be connected to the semiconductor layer ACT through a sixth opening OP6.

The fourth connection electrode CE4 may be connected to the semiconductor layer ACT through a seventh opening OP7 and an eighth opening OP8, respectively.

The fifth connection electrode CE5 may be connected to the semiconductor layer ACT through a ninth opening OP9, and may be connected to the Vsus line 1156 through a tenth opening OP10.

The sixth connection electrode CE6 may be connected to gate pattern 1153 through an eleventh opening OP11, and may be connected to the previous-stage scan line 152 through a twelfth opening OP12.

Then, referring to FIG. 29, a passivation layer PVX may be disposed on the first data conductive layer DE1. The passivation layer PVX may be omitted according to an exemplary embodiment.

Then, referring to FIG. 29, the first intermetal dielectric VIA1 may be disposed on the passivation layer PVX. The first intermetal dielectric VIA1 may be an organic layer.

Figure 34:
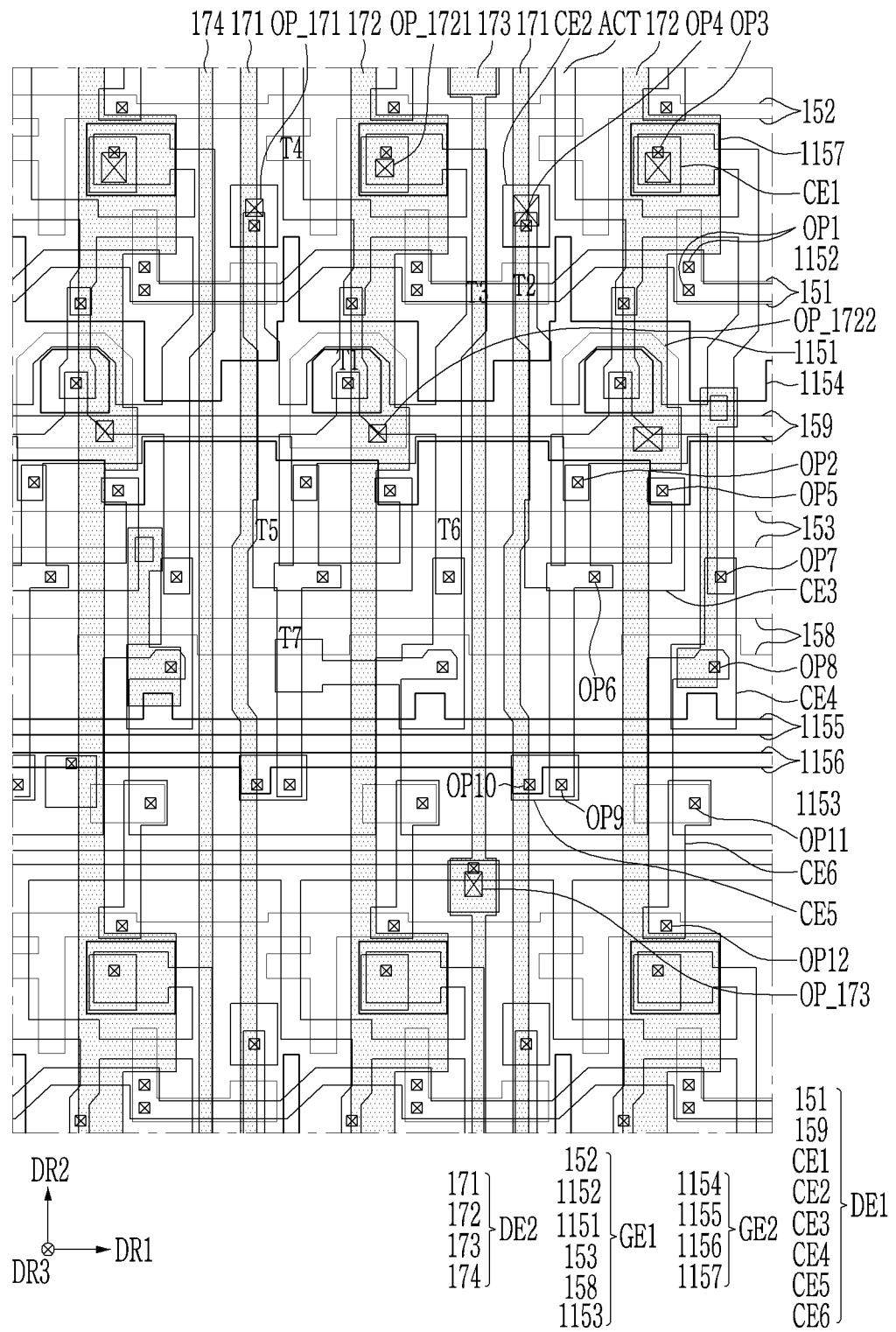

Then, referring to FIG. 28, FIG. 29, and FIG. 34, the second data conductive layer DE2 may be disposed on the first intermetal dielectric VIA1.

The second data conductive layer DE2 may include a data line 171, a driving voltage line 172, a first initialization voltage line 173, and a data auxiliary line 174 which are disposed along the second direction DR2.

The data line 171 may be disposed along the second direction DR2, and may be connected to the second connection electrode CE2 in a data opening OP_171. Since the second connection electrode CE2 is connected to the semiconductor layer ACT through the fourth opening OP4, a data voltage transferred to the data line 171 may be transferred to the semiconductor layer ACT.

The data auxiliary line 174 may be disposed along the second direction DR2 in parallel with the data line 171, to transfer a data voltage. The data auxiliary line 174 may be disposed in parallel with the data line 171 to reduce resistance.

The driving voltage line 172 may be connected to the first connection electrode CE1 through a first driving opening OP_1721.

In addition, the driving voltage line 172 may be connected to the auxiliary line 159 through a second driving opening OP_1722.

The first initialization voltage line 173 may be connected to the semiconductor layer ACT through a first initialization opening OP_173, and may transfer the first initialization voltage VINT1 to the semiconductor layer ACT. Although not illustrated, a second initialization voltage line may be disposed in another neighboring pixel, and may be connected to the semiconductor layer ACT to transfer a second initialization voltage VINT2 to the semiconductor layer ACT.

Next, referring to FIG. 29 and FIG. 34, the second intermetal dielectric VIA2 is disposed on the second data conductive layer DE2 including the data line 171 and the like. The second intermetal dielectric VIA2 may be removed in a region where the second data conductive layer DE2 is not disposed. The removal of the second intermetal dielectric VIA2 are the same as described above.

Next, referring to FIG. 28 and FIG. 29, the partition wall 350 may be disposed on the second intermetal dielectric VIA2 on the pixel electrode 191. The pixel electrode 191 includes a first pixel electrode 191a, a second pixel electrode 191b, and a third pixel electrode 191c, and each of the pixel electrodes may have a protrusion 195.

The partition wall 350 may have an opening 355 overlapping the protrusion 195, and the pixel electrode 191 may be connected to the semiconductor layer ACT or the like in the opening 355 of the partition wall 350 to receive a driving voltage for driving the light emitting diode LED. An emission layer 360 may be disposed in the opening 355 of the partition wall 350. A common electrode 270 may be disposed on the partition wall 350 and the emission layer 360. The pixel electrode 191, the emission layer 360, and the common electrode 270 may constitute a light emitting diode LED.

FIG. 28 to FIG. 34 illustrate detailed views of a configuration corresponding to the exemplary embodiment of FIG. 1 to FIG. 4. However, this is only an example, and it shall be obvious that a structure illustrated in FIG. 28 to FIG. 34 is applicable to the exemplary embodiments illustrated in FIG. 5 to FIG. 9, FIG. 10 to FIG. 14, FIG. 15 to FIG. 19, and FIG. 20 to FIG. 24.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
    a substrate;
    a plurality of first wires extending along a first direction on the substrate;
    a first insulating layer disposed on the plurality of first wires;
    a plurality of second wires disposed on the first insulating layer and extending along a second direction crossing the first direction;
    a second insulating layer disposed on the plurality of second wires; and
    a plurality of pixel electrodes disposed on the second insulating layer,
    wherein the second insulating layer includes a plurality of first removed regions each extending along the second direction, a length of each of the plurality of first removed regions along the second direction being longer than a length of at least one of the plurality of pixel electrodes along the second direction and a width of each of the plurality of first removed regions along the first direction being shorter than a width of at least one of the plurality of pixel electrodes along the first direction.

2. The display device of claim 1, wherein the plurality of second wires overlap the plurality of pixel electrodes, respectively, in a plan view and each of the plurality of first removed regions is disposed in an area disposed between the plurality of pixel electrodes that are adjacent to each other in the first direction.

3. The display device of claim 1, wherein the plurality of pixel electrodes include:
    a plurality of first pixel electrodes and a plurality of second pixel electrodes disposed in a first column along the second direction, and
    a plurality of third pixel electrodes disposed in a second column along the second direction, and
    wherein the plurality of first removed regions are disposed between the first column and the second column disposed adjacent to each other.

4. The display device of claim 1, wherein the first insulating layer is disposed to overlap the plurality of first wires in a plan view, and includes a second removed region disposed between adjacent first wires that are adjacent to each other in the second direction.

5. The display device of claim 4, wherein the second removed region extends along the first direction.

6. The display device of claim 4, wherein the first insulating layer includes a disconnected portion in an area corresponding to the plurality of first removed regions of the second insulating layers.

7. The display device of claim 6, wherein the first insulating layer includes a plurality of islands that are spaced apart from each other along the first direction.

8. The display device of claim 6, further comprising a passivation layer disposed between the plurality of first wires and the first insulating layer.

9. The display device of claim 1, wherein the plurality of first wires serve as scan lines for transferring scan signals and the plurality of second wires serve as data lines for transferring data voltages or driving voltage lines for transferring driving voltages.

10. The display device of claim 1, wherein each thickness of the first insulating layer and the second insulating layers are in a range of 10,000 Å to 16,000 Å.

11. The display device of claim 1, further comprising a partition wall disposed on the plurality of pixel electrodes,
    wherein the partition wall has an opening exposing the plurality of pixel electrodes and a portion of the partition wall protrudes to constitute a spacer.

12. The display device of claim 11, wherein the partition wall includes a black material.

13. The display device of claim 1, wherein the first insulating layer or the second insulating layers include a black material.

14. The display device of claim 1, wherein the first insulating layer or the second insulating layer include siloxane.

15. A display device comprising:
    a substrate;
    a plurality of first wires extending along a first direction on the substrate;
    a plurality of first insulating layers disposed on the plurality of first wires;
    a plurality of second wires disposed on the plurality of first insulating layers and extending along a second direction crossing the first direction;
    a second insulating layer disposed on the plurality of second wires; and
    a plurality of pixel electrodes disposed on the second insulating layer,
    wherein the plurality of first insulating layers are spaced apart and isolated from each other in the second direction and a width of the first insulating layers along the second direction is smaller than a space between adjacent first insulating layers along the second direction.

16. The display device of claim 15, wherein each of the plurality of first insulating layers includes a disconnected portion.

17. The display device of claim 15, wherein the second insulating layer is disposed to overlap the plurality of first wires and the plurality of second wires in a plan view.

18. The display device of claim 15, wherein the plurality of first wires serve as scan lines for transferring scan signals and the plurality of second wires serve as data lines for transferring data voltages or driving voltage lines for transferring driving voltages.

19. A display device comprising:
    a plurality of first wires extending along a first direction on a substrate;
    a first insulating layer disposed on the plurality of first wires;

a plurality of second wires disposed on the first insulating layer and extending along a second direction crossing the first direction;

a second insulating layer disposed on the plurality of second wires; and a plurality of pixel electrodes disposed on the second insulating layer, wherein the second insulating layer including a plurality of removed regions each extending along the second direction, a length of each of the plurality of first removed regions along the second direction being longer than a length of at least one of the plurality of pixel electrodes along the second direction, and a width of each of the plurality of first removed regions along the first direction being shorter than a width of at least one of the plurality of pixel electrodes along the first direction.

20. The display device of claim 19, wherein the plurality of second wires are disposed to overlap the plurality of pixel electrodes in a plan view and the plurality of removed regions is disposed between the plurality of pixel electrodes that are adjacent to each other in the first direction.

21. The display device of claim 20, wherein the first insulating layer is disposed to overlap the plurality of first wires in a plan view and has a removed portion extending along the first direction between adjacent first wires.

22. The display device of claim 21, wherein the first insulating layer extends along the first direction.

23. The display device of claim 21, wherein the first insulating layer is removed at an area that is overlapped with the plurality of removed regions of the second insulating layers.

24. The display device of claim 19, wherein the plurality of first wires serve as scan lines for transferring scan signals and the plurality of second wires serve as data lines for transferring data voltages or driving voltage lines for transferring driving voltages.

* * * * *